(12) United States Patent
Luo et al.

(10) Patent No.: US 11,917,817 B2
(45) Date of Patent: Feb. 27, 2024

(54) MICROELECTRONIC DEVICES, MEMORY DEVICES, AND ELECTRONIC SYSTEMS

(71) Applicant: Micron Technology, Inc., Boise, ID (US)

(72) Inventors: Shuangqiang Luo, Boise, ID (US); John D. Hopkins, Meridian, ID (US); Lifang Xu, Boise, ID (US); Nancy M. Lomeli, Boise, ID (US); Indra V. Chary, Boise, ID (US); Kar Wui Thong, Boise, ID (US); Shicong Wang, Meridain, ID (US)

(73) Assignee: Micron Technology, Inc., Boise, ID (US)

(*) Notice: Subject to any disclaimer, the term of this patent is extended or adjusted under 35 U.S.C. 154(b) by 219 days.

(21) Appl. No.: 17/125,200

(22) Filed: Dec. 17, 2020

(65) Prior Publication Data
US 2022/0199637 A1    Jun. 23, 2022

(51) Int. Cl.
*H10B 43/50* (2023.01)
*H10B 41/27* (2023.01)
(Continued)

(52) U.S. Cl.
CPC ............. *H10B 41/27* (2023.02); *G11C 5/025* (2013.01); *G11C 5/06* (2013.01); *H01L 21/768* (2013.01); *H10B 43/27* (2023.02)

(58) Field of Classification Search
CPC ......... H01L 27/11556; H01L 27/11582; H01L 27/11548; H01L 27/11575
See application file for complete search history.

(56) References Cited

U.S. PATENT DOCUMENTS 9,425,209 B1    8/2016  Yang et al.
2017/0256551 A1  9/2017  Lee
(Continued)

FOREIGN PATENT DOCUMENTS

CN    111710681 A    9/2020

OTHER PUBLICATIONS

International Search Report for Application No. PCT/US2021/062460, dated Apr. 1, 2022, 3 pages.
(Continued)

*Primary Examiner* — Sarah K Salerno
(74) *Attorney, Agent, or Firm* — TraskBritt

(57) ABSTRACT

A microelectronic device comprises a stack structure comprising a vertically alternating sequence of conductive material and insulative material arranged in tiers. The stack structure has blocks separated from one another by first dielectric slot structures. Each of the blocks comprises two crest regions, a stadium structure interposed between the two crest regions in a first horizontal direction and comprising opposing staircase structures each having steps comprising edges of the tiers of the stack structure, and two bridge regions neighboring opposing sides of the stadium structure in a second horizontal direction orthogonal to the first horizontal direction and having upper surfaces substantially coplanar with upper surfaces of the two crest regions. At least one second dielectric slot structure is within horizontal boundaries of the stadium structure in the first horizontal direction and partially vertically extends through and segmenting each of the two bridge regions. Memory devices, electronic systems, and methods of forming microelectronic devices are also described.

16 Claims, 17 Drawing Sheets

(51) Int. Cl.
  *H01L 21/768* (2006.01)
  *G11C 5/02* (2006.01)
  *G11C 5/06* (2006.01)
  *H10B 43/27* (2023.01)

(56) References Cited

U.S. PATENT DOCUMENTS

2019/0206727 A1\* 7/2019 Matovu ............. H01L 21/76811
2019/0237477 A1  8/2019 Baek et al.
2019/0287995 A1  9/2019 Oike et al.
2020/0161326 A1\* 5/2020 Oh .................... H01L 21/31111
2021/0098483 A1\* 4/2021 Kang ................ H01L 27/11556

OTHER PUBLICATIONS

Written Opinion of the International Searching Authority for Application No. PCT/US2021/062460, dated Apr. 1, 2022, 5 pages.

\* cited by examiner

US 11,917,817 B2

MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through one or more stack structures including tiers of conductive material and insulative material. Each string of memory cells may include at least one select device coupled thereto. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive material of the tiers of the stack structure(s) of the memory device and control logic devices (e.g., string drivers) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure(s) of the memory device. The staircase structure includes individual "steps" defining contact regions for the conductive material of the tiers, upon which conductive contact structures can be positioned to provide electrical access to the conductive material. In turn, conductive routing structures can be employed to couple the conductive contact structures to the control logic devices. However, conventional staircase structure fabrication techniques can segment the conductive material of an individual tier in a manner resulting in discontinuous conductive paths through the tier that can require the use of multiple (e.g., more than one) switching devices (e.g., transistors) of at least one string driver to drive voltages completely across the tier and/or in opposing directions across the tier.

DETAILED DESCRIPTION

Figure 1A:
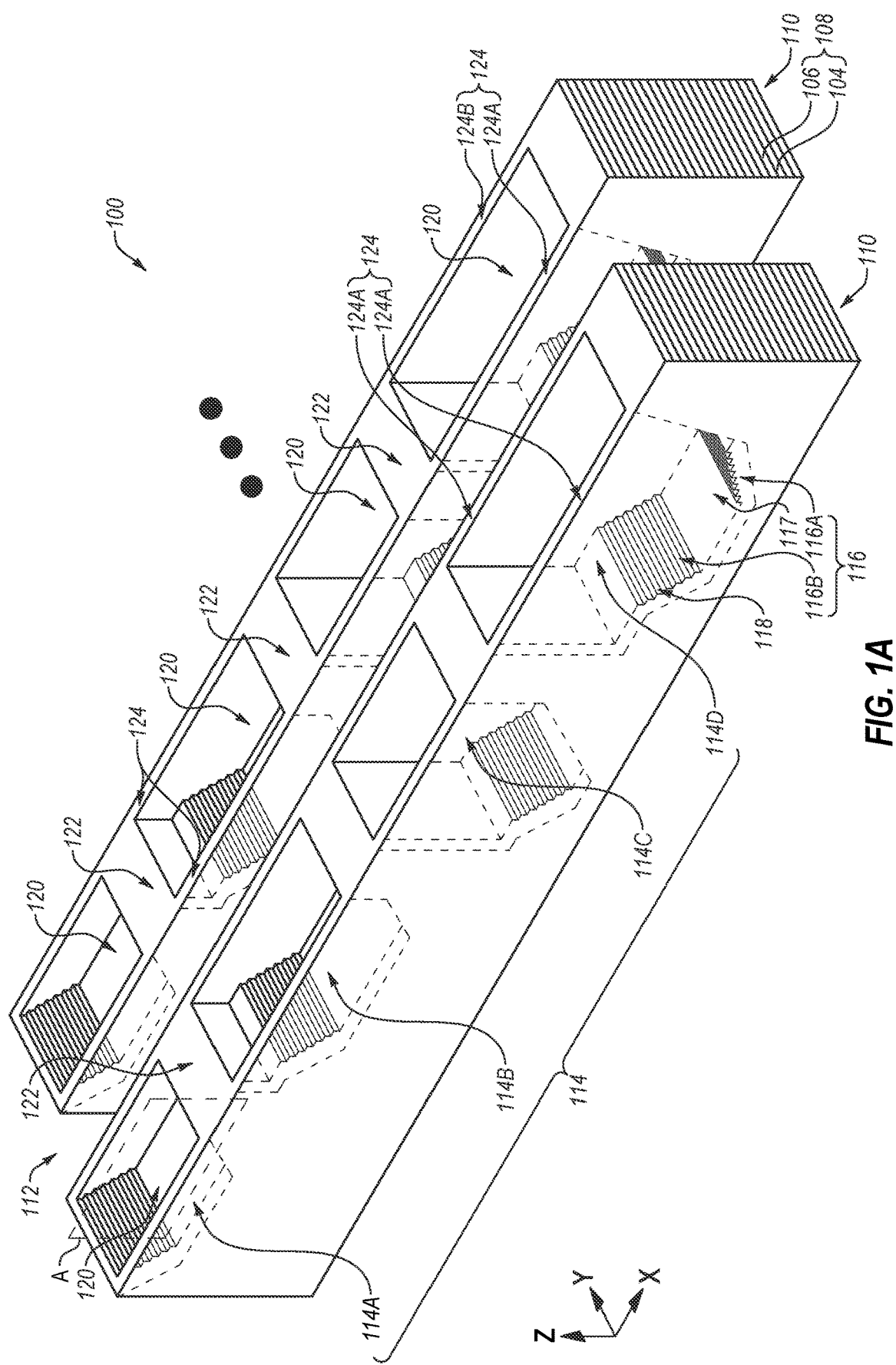
FIG. 1A is a simplified, partial perspective view of a microelectronic device structure at a processing stage of a method forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A through FIG. 5C are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 1B:
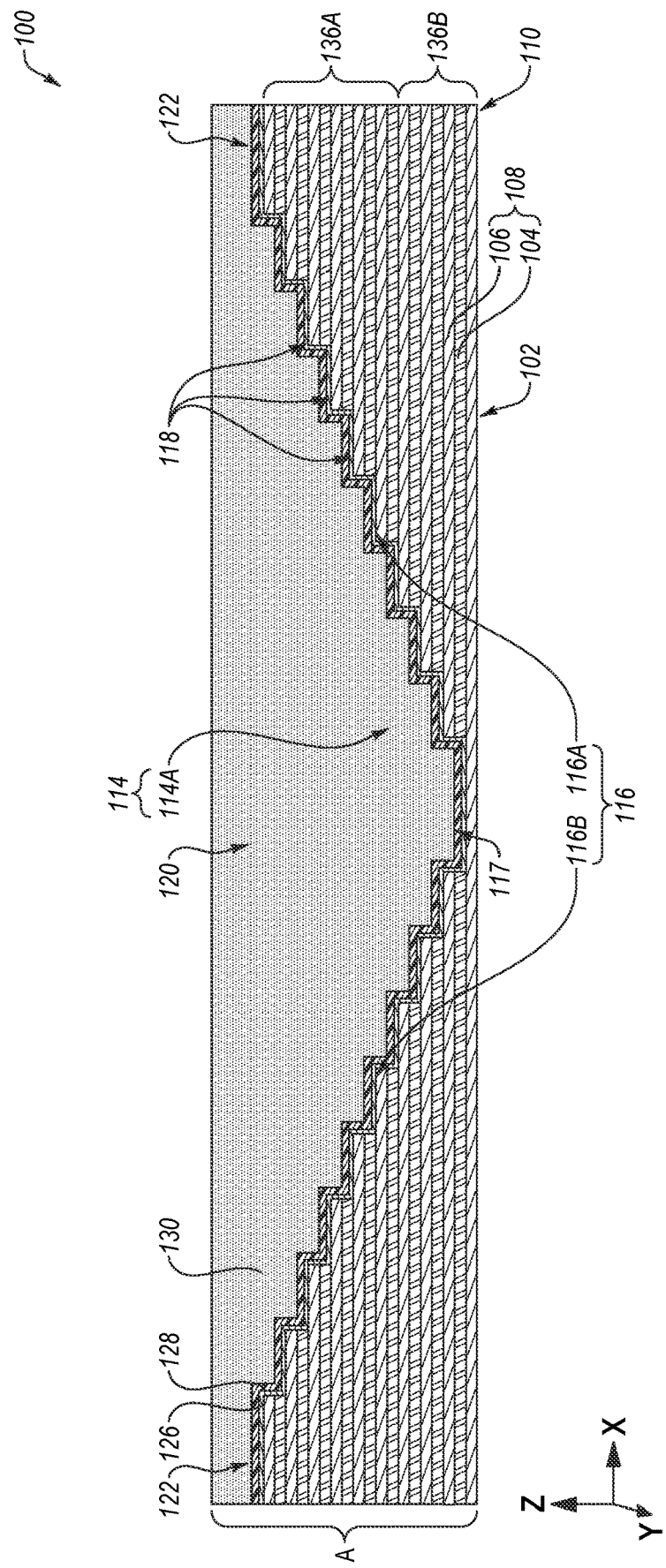
FIG. 1B is a simplified, longitudinal cross-sectional view of a portion A (identified with dashed lines in FIG. 1A) of the microelectronic device structure shown in FIG. 1A.

FIG. 1A depicts a simplified, partial perspective view of a microelectronic device structure 100. As shown in FIG. 1A, the microelectronic device structure 100 may be formed to include a preliminary stack structure 102 including a vertically alternating (e.g., in a Z-direction) sequence of insulative material 104 and sacrificial material 106 arranged in tiers 108. Each of the tiers 108 of the preliminary stack structure 102 may individually include the sacrificial material 106 vertically neighboring (e.g., directly vertically adjacent) the insulative material 104. In addition, the preliminary stack structure 102 may be divided (e.g., segmented, partitioned) into preliminary blocks 110 separated from one another by slots 112 (e.g., slits, openings, trenches). The slots 112 may vertically extend (e.g., in the Z-direction) completely through the preliminary stack structure 102. Additional features (e.g., materials, structures) of the preliminary stack structure 102 (including the preliminary blocks 110 thereof) are described in further detail below. FIG. 1B is a simplified, longitudinal cross-sectional view of a portion A (identified with a dashed box in FIG. 1A) of the microelectronic device structure 100 at the processing stage depicted in FIG. 1A.

The insulative material 104 of each of the tiers 108 of the preliminary stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., SiN$_y$), at least one dielectric oxynitride material (e.g., SiO$_x$N$_y$), and at least one dielectric carboxynitride material (e.g., SiO$_x$C$_z$N$_y$). In some embodiments, the insulative material 104 of each of the tiers 108 of the preliminary stack structure 102 is formed of and includes a dielectric oxide material, such as SiO$_x$ (e.g., SiO$_2$). The insulative material 104 of each of the tiers 108 may be substantially homogeneous, or the insulative material 104 of one or more (e.g., each) of the tiers 108 may be heterogeneous.

The sacrificial material 106 of each of the tiers 108 of the preliminary stack structure 102 may be formed of and include at least one material (e.g., at least one insulative material) that may be selectively removed relative to the insulative material 104. The sacrificial material 106 may be selectively etchable relative to the insulative material 104 during common (e.g., collective, mutual) exposure to a first etchant; and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative material 104, the sacrificial material 106 may be formed of and include one or more of at least one dielectric oxide material (e.g., one or more of SiO$_x$, phosphosilicate glass, borosilicate glass, borophosphosilicate glass, fluorosilicate glass, AlO$_x$, HfO$_x$, NbO$_x$, TiO$_x$, ZrO$_x$, TaO$_x$, and a MgO$_x$), at least one dielectric nitride material (e.g., SiN$_y$), at least one dielectric oxynitride material (e.g., SiO$_x$N$_y$), at least one dielectric oxycarbide material (e.g., SiO$_x$C$_y$), at least one hydrogenated dielectric oxycarbide material (e.g., SiC$_x$O$_y$H$_z$), at least one dielectric carboxynitride material (e.g., SiO$_x$C$_z$N$_y$), and at least one semiconductive material (e.g., polycrystalline silicon). In some embodiments, the sacrificial material 106 of each of the tiers 108 of the preliminary stack structure 102 is formed of and includes a dielectric nitride material, such as SiN$_y$ (e.g., Si$_3$N$_4$). The sacrificial material 106 may, for example, be selectively etchable relative to the insulative material 104 during common exposure to a wet etchant comprising phosphoric acid (H$_3$PO$_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

Still referring to FIG. 1A, the preliminary blocks 110 of the preliminary stack structure 102 may horizontally extend parallel in an X-direction (e.g., a first horizontal direction). As used herein, the term "parallel" means substantially parallel. Horizontally neighboring preliminary blocks 110 of the preliminary stack structure 102 may be separated from one another in a Y-direction (e.g., a second horizontal direction) orthogonal to the X-direction by the slots 112. The slots 112 may also horizontally extend parallel in the X-direction. Each of the preliminary blocks 110 of the preliminary stack structure 102 may exhibit substantially the same geometric configuration (e.g., substantially the same dimensions and substantially the same shape) as each other of the preliminary blocks 110, or one or more of the preliminary blocks 110 may exhibit a different geometric configuration (e.g., one or more different dimensions and/or a different shape) than one or more other of the preliminary blocks 110. In addition, each pair of horizontally neighboring preliminary blocks 110 of the preliminary stack structure 102 may be horizontally separated from one another by substantially the same distance (e.g., corresponding to a width in the Y-direction of each of the slots 112) as each other pair of horizontally neighboring preliminary blocks 110 of the preliminary stack structure 102, or at least one pair of horizontally neighboring preliminary blocks 110 of the preliminary stack structure 102 may be horizontally separated from one another by a different distance than that separating at least one other pair of horizontally neighboring preliminary blocks 110 of the preliminary stack structure 102. In some embodiments, the preliminary blocks 110 of the preliminary stack structure 102 are substantially uniformly (e.g., substantially non-variably, substantially equally, substantially consistently) sized, shaped, and spaced relative to one another.

As shown in FIG. 1A, each preliminary block 110 of the preliminary stack structure 102 may individually include stadium structures 114, crest regions 122 (e.g., elevated regions), and bridge regions 124 (e.g., additional elevated regions). The stadium structures 114 may be distributed throughout and substantially confined within a horizontal area of the preliminary block 110. The crest regions 122 may be horizontally interposed between stadium structures 114 horizontally neighboring one another in the X-direction. The bridge regions 124 may horizontally neighbor opposing sides of individual stadium structures 114 in the Y-direction, and may horizontally extend from and between crest regions 122 horizontally neighboring one another in the X-direction. In FIG. 1A, for clarity and ease of understanding the drawings and associated description, portions (e.g., some of the bridge regions 124 horizontally neighboring first sides of the stadium structures 114 in the Y-direction) of one of the preliminary blocks 110 of the preliminary stack structure 102 are depicted as transparent to more clearly show the stadium structures 114 distributed within the preliminary block 110.

Still referring to FIG. 1A, at least some (e.g., each) of the stadium structures 114 within an individual preliminary block 110 of the preliminary stack structure 102 may be positioned at different vertical elevations in the Z-direction than one another. For example, as depicted in FIG. 1A, an individual preliminary block 110 may include a first stadium structure 114A, a second stadium structure 114B at a relatively lower vertical position (e.g., in the Z-direction) within the preliminary block 110 than the first stadium structure 114A, a third stadium structure 114C at a relatively lower vertical position within the preliminary block 110 than the second stadium structure 114B, and a fourth stadium structure 114D at a relatively lower vertical position within the preliminary block 110 than the third stadium structure 114C. In addition, stadium structures 114 may be substantially uniformly (e.g., equally, evenly) horizontally spaced apart from one another. In additional embodiments, one or more blocks 110 of the preliminary stack structure 102 may individually include a different quantity of stadium structures 114 and/or a different distribution of stadium structures 114 than that depicted in FIG. 1A. For example, an individual preliminary block 110 of the preliminary stack structure 102 may include greater than four (4) of the stadium structures 114 (e.g., greater than or equal to five (5) of the stadium structures 114, greater than or equal to ten (10) of the stadium structures 114, greater than or equal to twenty-five (25) of the stadium structures 114, greater than or equal to fifty (50) of stadium structures 114), or less than four (4) of the stadium structures 114 (e.g., less than or equal to three (3) of the stadium structures 114, less than or equal to two (2) of the stadium structures 114, only one (1) of the stadium structures 114). As another example, within an individual preliminary block 110, stadium structures 114 may be at least partially non-uniformly (e.g., non-equally, non-evenly) horizontally spaced, such that at least one of the stadium structures 114 is separated from at least two other of the stadium structures 114 horizontally neighboring (e.g., in the X-direction) the at least one stadium structures 114 by different (e.g., non-equal) distances. As an additional non-limiting example, within an individual preliminary block 110, vertical positions (e.g., in the Z-direction) of the stadium structures 114 may vary in a different manner (e.g., may alternate between relatively deeper and relatively shallower vertical positions) than that depicted in FIG. 1A.

Each stadium structure 114 may include opposing staircase structures 116, and a central region 117 horizontally interposed between (e.g., in the X-direction) the opposing staircase structures 116. The opposing staircase structures 116 of each stadium structure 114 may include a forward staircase structure 116A and a reverse staircase structure 116B. A phantom line extending from a top of the forward staircase structure 116A to a bottom of the forward staircase structure 116A may have a positive slope, and another phantom line extending from a top of the reverse staircase structure 116B to a bottom of the reverse staircase structure 116B may have a negative slope. In additional embodiments, one or more of the stadium structure 114 may individually exhibit a different configuration than that depicted in FIG. 1A. As a non-limiting example, at least one stadium structures 114 may be modified to include a forward staircase structure 116A but not a reverse staircase structure 116B (e.g., the reverse staircase structure 116B may be absent), or at least one stadium structure 114 may be modified to include a reverse staircase structure 116B but not a forward staircase structure 116A (e.g., the forward staircase structure 116A may be absent). In such embodiments, the central region 117 horizontally neighbors a bottom of the forward staircase structure 116A (e.g., if the reverse staircase structure 116B is absent), or horizontally neighbors a bottom of the reverse staircase structure 116B (e.g., if the forward staircase structure 116A is absent).

The opposing staircase structures 116 (e.g., the forward staircase structure 116A and the reverse staircase structure 116B) of an individual stadium structure 114 each include steps 118 defined by edges (e.g., horizontal ends) of the tiers 108 of the preliminary stack structure 102 within a horizontal area of an individual preliminary block 110 of the preliminary stack structure 102. For the opposing staircase structures 116 of an individual stadium structure 114, each step 118 of the forward staircase structure 116A may have a counterpart step 118 within the reverse staircase structure 116B having substantially the same geometric configuration (e.g., shape, dimensions), vertical position (e.g., in the Z-direction), and horizontal distance (e.g., in the X-direction) from a horizontal center (e.g., in the X-direction) of the central region 117 of the stadium structure 114. In additional embodiments, at least one step 118 of the forward staircase structure 116A does not have a counterpart step 118 within the reverse staircase structure 116B having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114; and/or at least one step 118 of the reverse staircase structure 116B does not have a counterpart step 118 within the forward staircase structure 116A having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114.

Each of the stadium structures 114 within an individual preliminary block 110 of the preliminary stack structure 102 may individually include a desired quantity of steps 118. Each of the stadium structures 114 may include substantially the same quantity of steps 118 as each other of the stadium structures 114, or at least one of the stadium structures 114 may include a different quantity of steps 118 than at least one other of the stadium structures 114. In some embodiments, at least one of the stadium structures 114 includes a different (e.g., greater, lower) quantity of steps 118 than at least one other of the stadium structures 114. As shown in FIG. 1A, in some embodiments, the steps 118 of each of the stadium structures 114 are arranged in order, such that steps 118 directly horizontally adjacent (e.g., in the X-direction) one another correspond to tiers 108 of the preliminary stack structure 102 directly vertically adjacent (e.g., in the Z-direction) one another. In additional embodiments, the steps 118 of at least one of the stadium structures 114 are arranged out of order, such that at least some steps 118 of the stadium structure 114 directly horizontally adjacent (e.g., in the X-direction) one another correspond to tiers 108 of preliminary stack structure 102 not directly vertically adjacent (e.g., in the Z-direction) one another.

With continued reference to FIG. 1A, for an individual stadium structure 114, the central region 117 thereof may horizontally intervene (e.g., in the X-direction) between and separate the forward staircase structure 116A thereof from the reverse staircase structure 116B thereof. The central region 117 may horizontally neighbor a vertically lowermost step 118 of the forward staircase structure 116A, and may also horizontally neighbor a vertically lowermost step 118 of the reverse staircase structure 116B. The central region 117 of an individual stadium structure 114 may have any desired horizontal dimensions. In addition, within an individual preliminary block 110 of the preliminary stack structure 102, the central region 117 of each of the stadium structures 114 may have substantially the same horizontal dimensions as the central region 117 of each other of the stadium structures 114, or the central region 117 of at least one of the stadium structures 114 may have different horizontal dimensions than the central region 117 of at least one other of the stadium structures 114.

For each preliminary block 110 of the preliminary stack structure 102, each stadium structure 114 (including the forward staircase structure 116A, the reverse staircase structure 116B, and the central region 117 thereof) within the preliminary block 110 may individually partially define boundaries (e.g., horizontal boundaries, vertical boundaries) of a filled trench 120 vertically extending (e.g., in the Z-direction) through the preliminary block 110. The crest regions 122 and the bridge regions 124 horizontally neighboring an individual stadium structure 114 may also partially define the boundaries of the filled trench 120 associated with the stadium structure 114. The filled trench 120 may only vertically extend through tiers 108 of the preliminary stack structure 102 defining the forward staircase structure 116A and the reverse staircase structure 116B of the stadium structure 114; or may also vertically extend through additional tiers 108 of the preliminary stack structure 102 not defining the forward staircase structure 116A and the reverse staircase structure 116B of the stadium structure 114, such as additional tiers 108 of the preliminary stack structure 102 vertically overlying the stadium structure 114. Edges of the additional tiers 108 of the preliminary stack structure 102 may, for example, define one or more additional stadium structures vertically overlying and horizontally offset from the stadium structure 114. The filled trench 120 may be filled with one or more dielectric materials, as described in further detail below with reference to FIG. 1B.

Still referring to FIG. 1A, for each preliminary block 110 of the preliminary stack structure 102, the crest regions 122 (which may also be referred to as "elevated regions" or "plateau regions") and the bridge regions 124 (which may also be referred to as "additional elevated regions" or "additional plateau regions") thereof may comprise portions of the preliminary block 110 remaining following the formation of the stadium structures 114. Within each preliminary block 110, crest regions 122 and the bridge region 124 thereof may define horizontal boundaries (e.g., in the X-direction and in the Y-direction) of unremoved portions of the tiers 108 of the preliminary stack structure 102.

As shown in FIG. 1A, the crest regions 122 of an individual preliminary block 110 of the preliminary stack structure 102 may intervene between and separate stadium structures 114 horizontally neighboring one another in the X-direction. For example, one of the crest regions 122 may intervene between and separate the first stadium structure 114A and the second stadium structure 114B; an additional one of the crest regions 122 may intervene between and separate the second stadium structure 114B and the third stadium structure 114C; and a further one of the crest regions 122 may intervene between and separate the third stadium structure 114C and the fourth stadium structure 114D. A vertical height of the crest regions 122 in the Z-direction may be substantially equal to a maximum vertical height of the preliminary block 110 in the Z-direction; and a horizontal width of the crest regions 122 in the Y-direction may be substantially equal to a maximum horizontal width of the preliminary block 110 in the Y-direction. In addition, each of the crest regions 122 may individually exhibit a desired horizontal length in the X-direction. Each of the crest regions 122 of an individual preliminary block 110 of the preliminary stack structure 102 may exhibit substantially the same horizontal length in the X-direction as each other of the crest regions 122 of the preliminary block 110; or at least one of the crest regions 122 of the preliminary block 110 may exhibit a different horizontal length in the X-direction than at least one other of the crest regions 122 of the preliminary block 110.

As shown in FIG. 1A, the bridge regions 124 of an individual preliminary block 110 of the preliminary stack structure 102 may intervene between and separate the stadium structures 114 if the preliminary block 110 from the slots 112 horizontally neighboring the preliminary block 110 in the Y-direction. For example, for each stadium structure 114 within an individual preliminary block 110 of the preliminary stack structure 102, a first bridge region 124A may be horizontally interposed in the Y-direction between a first side of the stadium structure 114 and a first of the slots 112 horizontally neighboring the preliminary block 110; and a second bridge region 124B may be horizontally interposed in the Y-direction between a second side of the stadium structure 114 and a second of the slots 112 horizontally neighboring the preliminary block 110. The first bridge region 124A and the second bridge region 124B may horizontally extend in parallel in the X-direction. In addition, the first bridge region 124A and the second bridge region 124B and may each horizontally extend from and between crest regions 122 of the preliminary block 110 horizontally neighboring one another in the X-direction. The bridge regions 124 of the preliminary block 110 may be integral and continuous with the crest regions 122 of the preliminary block 110. Upper boundaries (e.g., upper surfaces) of the bridge regions 124 may be substantially coplanar with upper boundaries of the crest regions 122. A vertical height of the bridge regions 124 in the Z-direction may be substantially equal to a maximum vertical height of the preliminary block 110 in the Z-direction. In addition, each of the bridge regions 124 (including each first bridge region 124A and each second bridge region 124B) may individually exhibit a desired horizontal width in the Y-direction and a desired horizontal length in the X-direction. Each of the bridge regions 124 of the preliminary block 110 may exhibit substantially the same horizontal length in the X-direction as each other of the bridge regions 124 of the preliminary block 110; or at least one of the bridge regions 124 of the preliminary block 110 may exhibit a different horizontal length in the X-direction than at least one other of the bridge regions 124 of the preliminary block 110. In addition, each of the bridge regions 124 of the preliminary block 110 may exhibit substantially the same horizontal width in the Y-direction as each other of the bridge regions 124 of the preliminary block 110; or at least one of the bridge regions 124 of the preliminary block 110 may exhibit a different horizontal width in the Y-direction than at least one other of the bridge regions 124 of the preliminary block 110.

For each preliminary block 110 of the preliminary stack structure 102, the bridge regions 124 thereof horizontally extend around the filled trenches 120 of the preliminary block 110. As described in further detail below, following subsequent processing (e.g., so-called "replacement gate" or "gate last" processing), some of the bridge regions 124 of the preliminary block 110 may be employed to form continuous conductive paths extending from and between horizontally neighboring crest regions 122 of the preliminary block 110. As also described in further detail below, following such subsequent (e.g., replacement gate) processing, at least the bridge regions 124 (e.g., the first bridge region 124A and the second bridge region 124B) horizontally neighboring the first stadium structure 114A in the Y-direction may be further acted upon (e.g., segmented) to disrupt (e.g., break) at least a portion of the continuous conductive paths extending from and between the crest regions 122 horizontally neighboring the first stadium structure 114A in the X-direction.

As previously described, FIG. 1B is a simplified, longitudinal cross-sectional view of portion A (identified with a dashed box in FIG. 1A) of the microelectronic device structure 100 at the processing stage depicted in FIG. 1A. The portion A encompasses the first stadium structure 114A of an individual preliminary block 110 (FIG. 1A) of the preliminary stack structure 102 (FIG. 1A). The portion A also encompasses parts of the bridge regions 124 (FIG. 1A) horizontally neighboring the first stadium structure 114A in the Y-direction; parts of the crest regions 122 horizontally neighboring the first stadium structure 114A in the X-direction; and the filled trench 120 having boundaries defined by the first stadium structure 114A, and each of the bridge regions 124 and the crest regions 122 horizontally neighboring the first stadium structure 114A. While additional features (e.g., structures, materials) of the microelectronic device structure 100 are described hereinbelow with reference to the portion A of the microelectronic device structure 100, such additional features may also be formed and included in additional portions of the microelectronic device structure 100, including additional portions encompassing additional stadium structures 114 of one or more (e.g., each) of the preliminary blocks 110 (FIG. 1A) of the preliminary stack structure 102 (FIG. 1A) and parts of the bridge regions 124 (FIG. 1A), the crest regions 122, and the filled trenches 120 having boundaries defined by the additional stadium structures 114.

Referring to FIG. 1B, the filled trenches 120 may individually be filled with multiple (e.g., more than one) dielectric materials. For example, as shown in FIG. 1B, each filled trench 120 may include a first dielectric material 126 (e.g., a dielectric liner material), a second dielectric material 128 (e.g., an additional dielectric liner material), and a third dielectric material 130 (e.g., a dielectric fill material). For an individual filled trench 120, the first dielectric material 126 may be formed on or over surfaces (e.g., horizontally extending surfaces, vertically extending surfaces) of the stadium structure 114 (e.g., the first stadium structure 114A), the crest regions 122, and the bridge regions 124 (FIG. 1A) of the preliminary block 110 (FIG. 1A) defining boundaries (e.g., horizontal boundaries, vertical boundaries) of the filled trench 120; the second dielectric material 128 may be formed on or over the first dielectric material 126; and the third dielectric material 130 may be formed on or over the second dielectric material 128. As depicted in FIG. 1B, one or more (e.g., each) of the first dielectric material 126, the second dielectric material 128, and the third dielectric material 130 may also be formed to extend beyond boundaries (e.g., horizontal boundaries, vertical boundaries) of the filled trenches 120. For example, first dielectric material 126, the second dielectric material 128, and the third dielectric material 130 may also be formed to extend over uppermost surfaces of the crest regions 122 and/or the bridge regions 124 (FIG. 1A) of individual preliminary blocks 110 (FIG. 1A) of the preliminary stack structure 102 (FIG. 1A) of the microelectronic device structure 100. In additional embodiments, the first dielectric material 126 and the second dielectric material 128 may be omitted (e.g., absent).

The first dielectric material 126 may be employed (e.g., serve) as a barrier material to protect (e.g., mask) the second dielectric material 128 from removal during subsequent processing acts (e.g., subsequent replacement gate processing acts, such as subsequent etching acts), as described in further detail below. The first dielectric material 126 may be formed to have a desired thickness capable of protecting the second dielectric material 128 during the subsequent processing acts. The first dielectric material 126 may be formed to substantially continuously extend on or over surfaces of the preliminary blocks 110 of the preliminary stack structure 102 outside of the horizontal boundaries of the slots 112 (FIG. 1A). For each of the preliminary blocks 110, the first dielectric material 126 may substantially continuously extend on or over surfaces of the opposing staircase structures 116 (e.g., the forward staircase structure 116A and the reverse staircase structure 116B) of each of the stadium structures 114 (e.g., the first stadium structure 114A, the second stadium structure 114B, the third stadium structure 114C, the fourth stadium structure 114D), as well as on or over inner sidewalls of the bridge regions 124 (FIG. 1A) (e.g., the first bridge region 124A, the second bridge region 124B) horizontally neighboring (e.g., in the Y-direction) each of the stadium structures 114. In addition, for each of the preliminary blocks 110, the first dielectric material 126 may also substantially continuously extend on or over upper surfaces of the crest regions 122 and the bridge regions 124. Surfaces of the preliminary blocks 110 (FIG. 1A) defining the horizontal boundaries of the slots 112 (FIG. 1A) may be substantially free of the first dielectric material 126. The first dielectric material 126 may be omitted (e.g., absent) from the slots 112 (FIG. 1A) between the preliminary blocks 110 (FIG. 1A) of the preliminary stack structure 102 (FIG. 1A).

The first dielectric material 126 may be formed of and include at least one dielectric material having different etch selectivity than the sacrificial material 106 of the tiers 108 of the preliminary stack structure 102. The first dielectric material 126 may also have different etch selectivity than the second dielectric material 128. The first dielectric material 126 may, for example, have etch selectively substantially similar to that of the insulative material 104 of the tiers 108 of the preliminary stack structure 102. By way of non-limiting example, the first dielectric material 126 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric oxynitride material (e.g., $SiO_xN_y$), and at least one dielectric carboxynitride material (e.g., $SiO_xC_zN_y$). In some embodiments, the first dielectric material 126 is formed of and includes $SiO_x$ (e.g., $SiO_2$).

The second dielectric material 128 may be employed (e.g., serve) as an etch stop material during subsequent processing acts (e.g., subsequent etching acts) to form openings (e.g., contact openings, contact vias) vertically extending through the third dielectric material 130, as described in further detail below. The second dielectric material 128 may be formed to have a desired thickness capable of protecting the first dielectric material 126 underlying the second dielectric material 128 from removal during the subsequent processing acts. The second dielectric material 128 may be formed to substantially continuously extend on or over the first dielectric material 126. The second dielectric material 128 may be omitted (e.g., absent) from the slots 112 (FIG. 1A) between the preliminary blocks 110 (FIG. 1A) of the preliminary stack structure 102 (FIG. 1A).

The second dielectric material 128 may be formed of and include at least one dielectric material having different etch selectivity than the third dielectric material 130. The second dielectric material 128 may also have different etch selectivity than the first dielectric material 126. The second dielectric material 128 may, for example, have etch selectively substantially similar to that of the sacrificial material 106 of the tiers 108 of the preliminary stack structure 102. By way of non-limiting example, the second dielectric material 128 may be formed of and include at least one nitrogen-containing dielectric material, such as at least one dielectric nitride material. In some embodiments, the second dielectric material 128 is formed of and includes $SiN_y$ (e.g., $Si_3N_4$).

Still referring to FIG. 1B, the third dielectric material 130 may substantially fill portions of the filled trenches 120 unoccupied by the first dielectric material 126 and the second dielectric material 128. The third dielectric material 130 may be formed to substantially continuously extend on or over the second dielectric material 128. The third dielectric material 130 may be omitted (e.g., absent) from the slots 112 (FIG. 1A) between the preliminary blocks 110 (FIG. 1A) of the preliminary stack structure 102 (FIG. 1A). The third dielectric material 130 may be formed to exhibit a substantially planer upper vertical boundary, and a substantially non-planar lower vertical boundary complementary to (e.g., substantially mirroring) a topography thereunder.

The third dielectric material 130 may be formed of and include at least one dielectric material having different etch selectivity than the second dielectric material 128. The third dielectric material 130 may, for example, have etch selectively substantially similar to that of one or more of the first dielectric material 126 the insulative material 104 of the tiers 108 of the preliminary stack structure 102. By way of non-limiting example, the third dielectric material 130 may be formed of and include at least one oxygen-containing dielectric material, such as a one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric oxynitride material (e.g., $SiO_xN_y$), and at least one dielectric carboxynitride material (e.g., $SiO_xC_zN_y$). In some embodiments, the third dielectric material 130 is formed of and includes $SiO_x$ (e.g., $SiO_2$).

As described in further detail below with reference to FIG. 4B, the microelectronic device structure 100 may be formed to further include support pillars vertically extending through the preliminary blocks 110 of the preliminary stack structure 102. The support pillars may be configured and positioned to support the tiers 108 of the preliminary stack structure 102 during subsequent processing (e.g., replacement gate processing) of the microelectronic device structure 100. For example, within each of the preliminary blocks 110, the support pillars may be configured and positioned to impede (e.g., substantially prevent) collapse of portions of the insulative material 104 of the tiers 108 with horizontal areas of the stadium structures 114 during subsequent replacement gate processing acts.

Next, referring to FIG. 2, which is a simplified, longitudinal cross-sectional view of the portion A of the microelectronic device structure 100 following (e.g., subsequent to) the processing stage previously described with reference to FIGS. 1A and 1B, the microelectronic device structure 100 may be subjected to replacement gate processing. The replacement gate processing may at least partially (e.g., substantially) replace the sacrificial material 106 (FIGS. 1A and 1B) of the tiers 108 (FIGS. 1A and 1B) of the preliminary stack structure 102 (FIGS. 1A and 1B) with conductive material 134. The replacement gate processing may convert the preliminary stack structure 102 (FIGS. 1A and 1B) including the preliminary blocks 110 (FIGS. 1A and 1B) into a stack structure 132 including blocks 133. The stack structure 132 may include a vertically alternating (e.g., in the Z-direction) sequence of the insulative material 104 and the conductive material 134 arranged in tiers 136. The stack structure 132 may be divided into the blocks 133, and the shapes and dimensions of the blocks 133 may be substantially the same as the shapes and dimensions of the preliminary blocks 110 (FIGS. 1A and 1B) of the preliminary stack structure 102 (FIGS. 1A and 1B). The slots 112 (FIGS. 1A and 1B) may be interposed between horizontally neighboring (e.g., in the Y-direction) blocks 133 of the stack structure 132.

The conductive material 134 of the tiers 136 of the stack structure 132 may formed of and include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive material 134 is formed of and includes W. Optionally, at least one liner material (e.g., at least one insulative liner material, at least one conductive liner materials) may be formed around the conductive material 134. The liner material may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive material 134. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the tiers 136 of the stack structure 132, $AlO_x$ (e.g., $Al_2O_3$) may be formed directly adjacent the insulative material 104, $TiN_x$ (e.g., TiN) may be formed directly adjacent the $AlO_x$, and W may be formed directly adjacent the $TiN_x$. For clarity and ease of understanding the description, the liner material is not illustrated in FIG. 2, but it will be understood that the liner material may be disposed around the conductive material 134.

Within each block 133 of the stack structure 132, the conductive material 134 of one or more relatively vertically higher tier(s) 136A (e.g., upper tiers) may be employed to form upper select gate structures (e.g., drain side select gate (SGD) structures) for upper select transistors (e.g., drain side select transistors) of the block 133, as described in further detail below. The conductive material 134 of the relatively vertically higher tier(s) 136A may be segmented by one or more filled slot(s) (e.g., filled SGD slot(s)) to form the upper select gate structures of the block 133, as also described in further detail below. In some embodiments, within each block 133 of the stack structure 132, the conductive material 134 of each of less than or equal to eight (8) relatively higher tier(s) 136A (e.g., from one (1) relatively vertically higher tier 136A to eight (8) relatively vertically higher tiers 136A) of the stack structure 132 is employed to form upper select gate structures (e.g., SGD structures) for the block 133. In addition, within each block 133 of the stack structure 132, the conductive material 134 of at least some relatively vertically lower tiers 136B vertically underlying the relatively vertically higher tier(s) 136A may be employed to form access line structures (e.g., word line structures) of the block 133, as also described in further detail below. Moreover, within each block 133 of the stack structure 132, the conductive material 134 of at least a vertically lowest tier 136 may be employed to form as at least one lower select gate structure (e.g., at least one source side select gate (SGS) structure) for lower select transistors (e.g., source side select transistors) of the block 133, as also described in further detail below.

The replacement gate processing employed to form the stack structure 132 may include treating the microelectronic device structure 100 with at least one wet etchant formulated to selectively remove portions of the sacrificial material 106 (FIGS. 1A and 1B) of the tiers 108 (FIGS. 1A and 1B) of the preliminary stack structure 102 (FIGS. 1A and 1B) through the slots 112 (FIG. 1A) between the preliminary blocks 110 (FIG. 1A). The wet etchant may be selected to remove the portions of the sacrificial material 106 (FIGS. 1A and 1B) without substantially removing portions of the insulative material 104 of the tiers 108 (FIGS. 1A and 1B) of the preliminary stack structure 102 (FIGS. 1A and 1B), and without substantially removing portions of the first dielectric material 126. During the material removal process, the first dielectric material 126 may protect (e.g., mask) the second dielectric material 128 from being removed. In some embodiments wherein the sacrificial material 106 (FIGS. 1A and 1B) comprises a dielectric nitride material (e.g., $SiN_y$, such as $Si_3N_4$) and the insulative material 104 and the first dielectric material 126 comprise a dielectric oxide material (e.g., $SiO_x$, such as $SiO_2$), the sacrificial material 106 (FIGS. 1A and 1B) of the tiers 108 (FIGS. 1A and 1B) of the preliminary stack structure 102 (FIGS. 1A and 1B) is at selectively removed using a wet etchant comprising $H_3PO_4$. Following the selective removal of the portions of the sacrificial material 106 (FIGS. 1A and 1B), the resulting recesses may be filled with the conductive material 134 to form the stack structure 132 (including the tiers 136 and the blocks 133 thereof). In addition, following the formation of the stack structure 132, the slots 112 (FIG. 1A) between the blocks 133 of the stack structure 132 may be filled with dielectric material to form filled slots (as described in further detail below with reference to FIG. 4B) horizontally interposed between horizontally neighboring blocks 133 of the stack structure 132.

Figure 2:
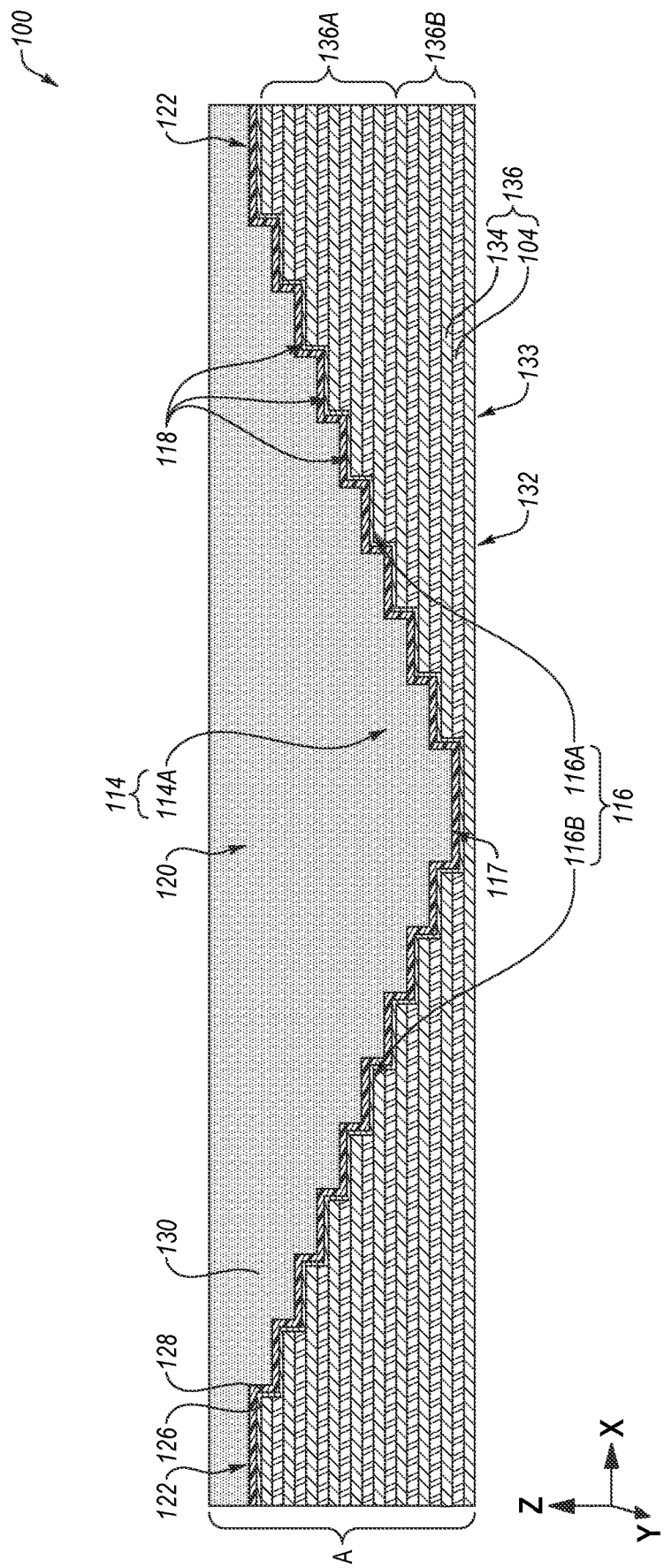
FIG. 2 is a simplified, longitudinal cross-sectional view of the portion A of the microelectronic device structure shown in FIGS. 1A and 1B at another processing stage of the method forming the microelectronic device following the processing stage of FIGS. 1A and 1B.
Figure 3:
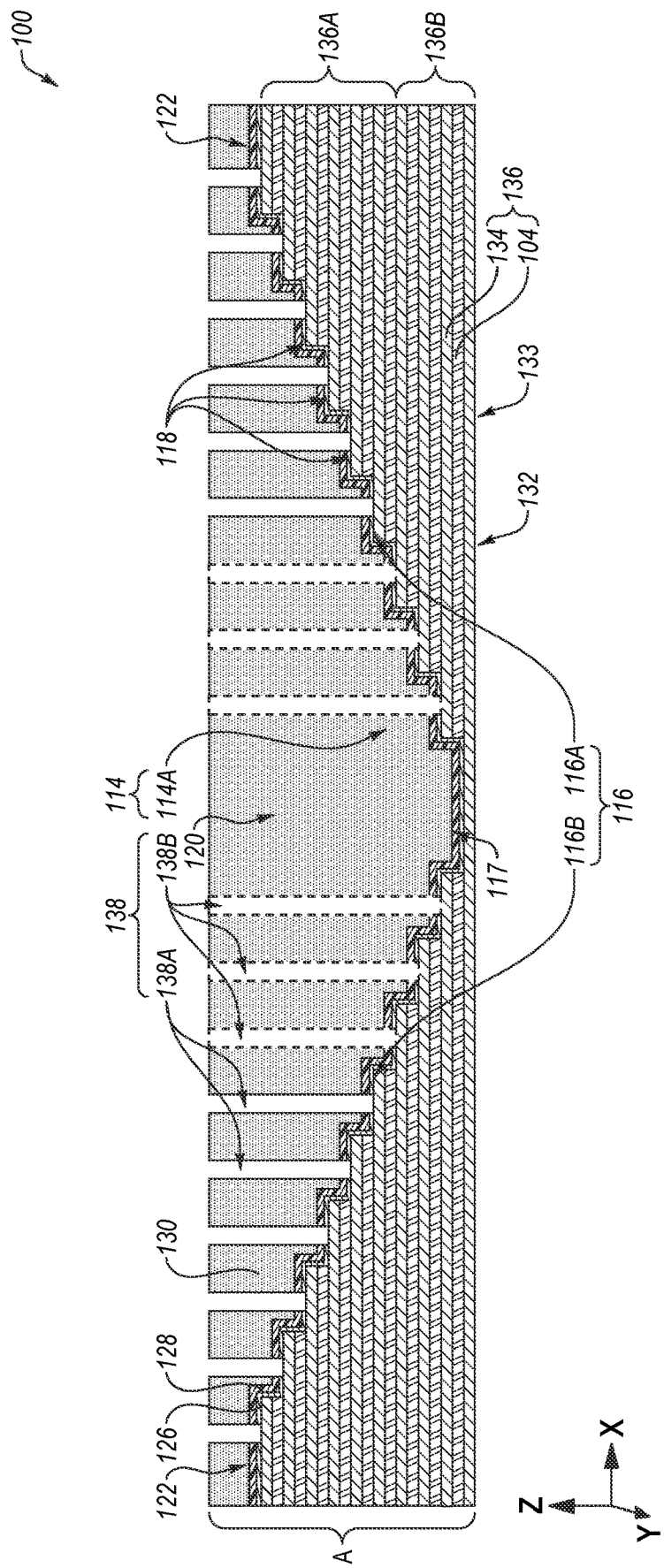
FIG. 3 is a simplified, longitudinal cross-sectional view of the portion A of the microelectronic device structure shown in FIGS. 1A and 1B at another processing stage of the method forming the microelectronic device following the processing stage of FIG. 2.

Referring next to FIG. 3, which is a simplified, longitudinal cross-sectional view of the portion A of the microelectronic device structure 100 following the processing stage previously described with reference to FIG. 2, portions of third dielectric material 130, the second dielectric material 128, and the first dielectric material 126 are removed (e.g., etched) to form contact openings 138 (e.g., apertures, vias) vertically extending (e.g., in the Z-direction) therethrough. The contact openings 138 may vertically extend to steps 118 of one or more (e.g., each) of the stadium structures 114, such as steps 118 of the forward staircase structure 116A of one or more of the stadium structures 114 and/or steps 118 of the reverse staircase structure 116B of one or more of the stadium structures 114. A bottom (e.g., lower vertical end) of each contact opening 138 may expose and be defined by an upper surface of the conductive material 134 of an individual tier 136 of the stack structure 132 at an individual step 118 of an individual stadium structure 114 of an individual block 133 of the stack structure 132.

As shown in FIG. 3, within a horizontal area of the first stadium structure 114A (e.g., a vertically uppermost stadium structure 114) within an individual block 133 of the stack structure 132, the contact openings 138 may include first contact openings 138A and second contact openings 138B. Within horizontal boundaries of the block 133, the first contact openings 138A may vertically extend to and terminate at the relatively vertically higher tier(s) 136A of the stack structure 132, and the second contact openings 138B may vertically extend to and terminate at the relatively vertically lower tiers 136B of the stack structure 132. The first contact openings 138A may vertically extend to and partially expose upper select gate structures (e.g., SGD structures) of the block 133 formed by portions of the conductive material 134 of individual relatively vertically higher tier(s) 136A of the stack structure 132. The second contact openings 138B may vertically extend to and partially expose access line structures of the block 133 formed by the conductive material 134 of individual relatively vertically lower tiers 136B of the stack structure 132.

Within each block 133 of the stack structure 132, each contact opening 138 may be formed at desired a horizontal position (e.g., in the X-direction and the Y-direction) on or over one of the steps 118 of one of the stadium structures 114. As described in further detail below with reference to FIG. 4C, in some embodiments, within a horizontal area of the first stadium structure 114A, at least some of the second contact openings 138B are horizontally offset in the Y-direction from at least some of the first contact openings 138A.

In FIG. 3, such horizontal offset is depicted by way of dashed lines at the boundaries (e.g., horizontal boundaries, vertical boundaries) of the second contact openings 138B. In addition, individual steps 118 of the first stadium structure 114A (e.g., individual steps 118 of the forward staircase structure 116A thereof, individual steps 118 of the reverse staircase structure 116B thereof) may have a single (e.g., only one) contact opening 138 vertically extending thereto, may have multiple (e.g., more than one) contact openings 138 vertically extending thereto, or may have no contact openings 138 vertically extending thereto.

The contact openings 138 may each individually be formed to exhibit a desired horizontal cross-sectional shape. In some embodiments, each of the contact openings 138 is formed to exhibit a substantially circular horizontal cross-sectional shape. In additional embodiments, one or more (e.g., each) of the contact openings 138 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, and an irregular cross-sectional shape. In addition, each of the contact openings 138 may be formed to exhibit substantially the same horizontal cross-sectional dimensions (e.g., substantially the same horizontal diameter), or at least one of the contact openings 138 may be formed to exhibit one or more different horizontal cross-sectional dimensions (e.g., a different horizontal diameter) than at least one other of the contact openings 138. In some embodiments, all of the contact openings 138 are formed to exhibit substantially the same horizontal cross-sectional dimensions.

The contact openings 138 may be formed using multiple material removal acts. For example, portions of the third dielectric material 130 may be removed using a first material removal act (e.g., a first etching process) to form preliminary contact openings vertically extending to and exposing portions of the second dielectric material 128; and then portions of the second dielectric material 128 and the first dielectric material 126 within horizontal boundaries of the preliminary contact openings may be removed using a second material removal act (e.g., a second etching process) to vertically extend the preliminary contact openings to the steps 118 of the stadium structures 114 and form the contact openings 138. As a non-limiting example, the first material removal act may comprise a first etching process (e.g., anisotropic dry etching, such as one or more of RIE, deep RIE, plasma etching, reactive ion beam etching, and chemically assisted ion beam etching); and the second material removal act may comprise a second, different etching process (e.g., a so-called "punch through" etch). During the first etching process, the second dielectric material 128 may serve as a so-called "etch stop" material to protect underlying portions of the first dielectric material 126 and the stack structure 132 from removal.

Figure 4A:
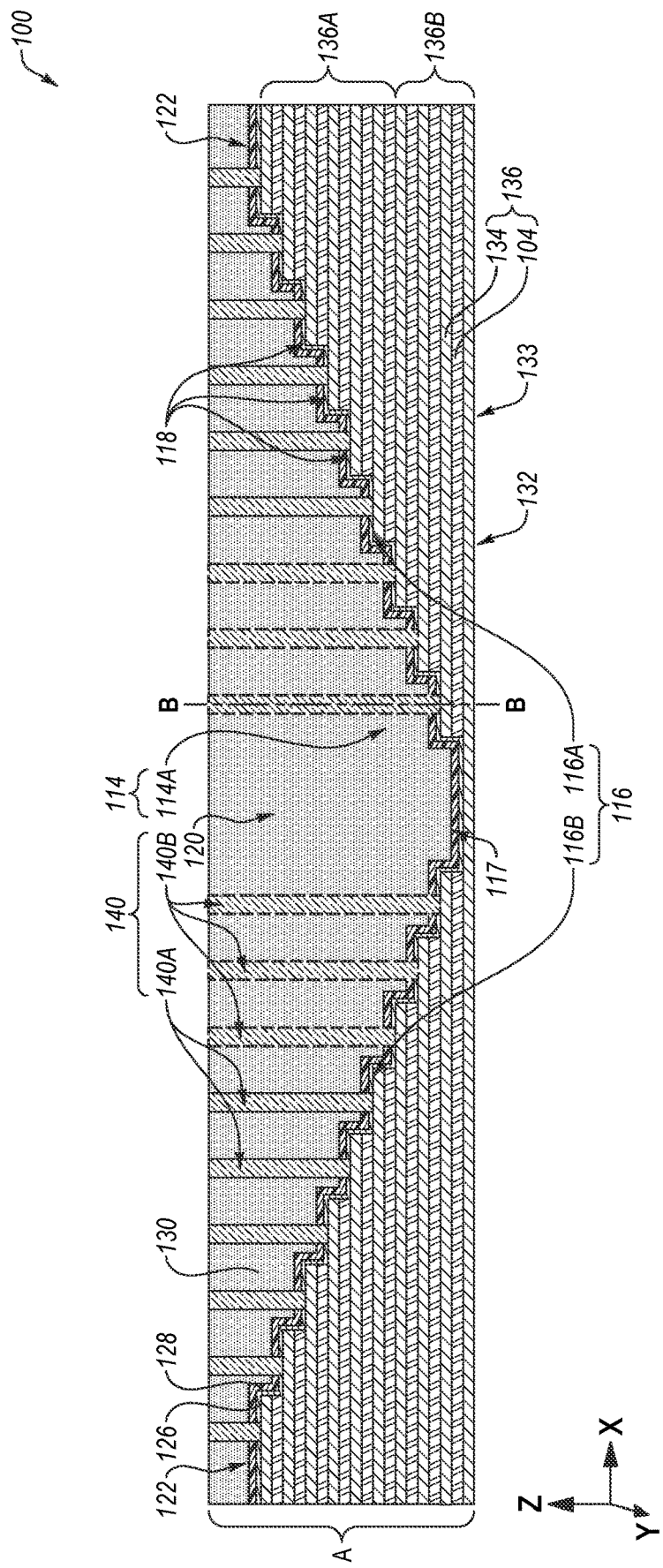
FIG. 4A is a simplified, longitudinal cross-sectional view of the portion A of the microelectronic device structure shown in FIGS. 1A and 1B at another processing stage of the method forming the microelectronic device following the processing stage of FIG. 3.

Referring next to FIG. 4A, which is a longitudinal cross-sectional view of the portion A of the microelectronic device structure 100 subsequent to the processing stage previously described with reference to FIG. 3, contact structures 140 may be formed within the contact openings 138 (FIG. 3). The contact structures 140 may be substantially confined within boundaries (e.g., horizontal boundaries, vertical boundaries) of the contact openings 138 (FIG. 3), and may substantially fill the contact openings 138 (FIG. 3). Each contact structure 140 may have a geometric configuration (e.g., shape, dimensions) corresponding to (e.g., substantially the same as) a geometric configuration of the contact opening 138 (FIG. 3) filled with the contact structure 140. As shown in FIG. 4A, each contact structure 140 may have an uppermost vertical boundary (e.g., an uppermost surface) substantially coplanar with an uppermost vertical boundary (e.g., an uppermost surface) of the third dielectric material 130, and a lowermost vertical boundary (e.g., a lowermost surface) vertically adjacent an uppermost vertical boundary (e.g., an uppermost surface) of the conductive material 134 of an individual tier 136 of the stack structure 132. Each contact structure 140 may individually contact (e.g., physically contact, electrically contact) the conductive material 134 of the individual tier 136 of the stack structure 132 at an individual step 118 of an individual stadium structure 114 of an individual block 133 of the stack structure 132.

As shown in FIG. 4A, within a horizontal area of the first stadium structure 114A (e.g., a vertically uppermost stadium structure 114) within an individual block 133 of the stack structure 132, the contact structure 140 may include first contact structures 140A filling the first contact openings 138A (FIG. 3), and second contact structures 140B filling the second contact openings 138B. Within horizontal boundaries of the block 133, the first contact structures 140A may vertically extend to and terminate at the relatively vertically higher tier(s) 136A of the stack structure 132, and the second contact structures 140B may vertically extend to and terminate at the relatively vertically lower tiers 136B of the stack structure 132. The first contact structures 140A may vertically extend to and physically contact upper select gate structures (e.g., SGD structures) of the block 133 formed by portions of the conductive material 134 of individual relatively vertically higher tier(s) 136A of the stack structure 132. The second contact structures 140B may vertically extend to and physically contact local access line structures of the block 133 formed by the conductive material 134 of individual relatively vertically lower tiers 136B of the stack structure 132.

The contact structures 140 may be formed of and include conductive material. As a non-limiting example, the contact structures 140 may be formed of and include one or more of at least one metal, at least one alloy, and at least one conductive metal-containing material (e.g., a conductive metal nitride, a conductive metal silicide, a conductive metal carbide, a conductive metal oxide). A material composition of the contact structures 140 may be substantially the same as a material composition of the conductive material 134 of the tiers 136 of the stack structure 132, or the material composition of the contact structures 140 may be different than the material composition of the conductive material 134 of the tiers 136 of the stack structure 132. In some embodiments, the contact structures 140 are individually formed of and includes W. The contact structures 140 may individually be homogeneous, or the contact structures 140 may individually be heterogeneous.

The contact structures 140 may be formed by forming (e.g., non-conformably depositing, such as through one or more of a PVD process and a non-conformal CVD process) conductive material inside and outside of the contact openings 138 (FIG. 3), and then removing (e.g., through an abrasive planarization process, such as a CMP process) portions of the conductive material overlying an uppermost vertical boundary (e.g., an uppermost surface) of the third dielectric material 130.

Figure 4B:
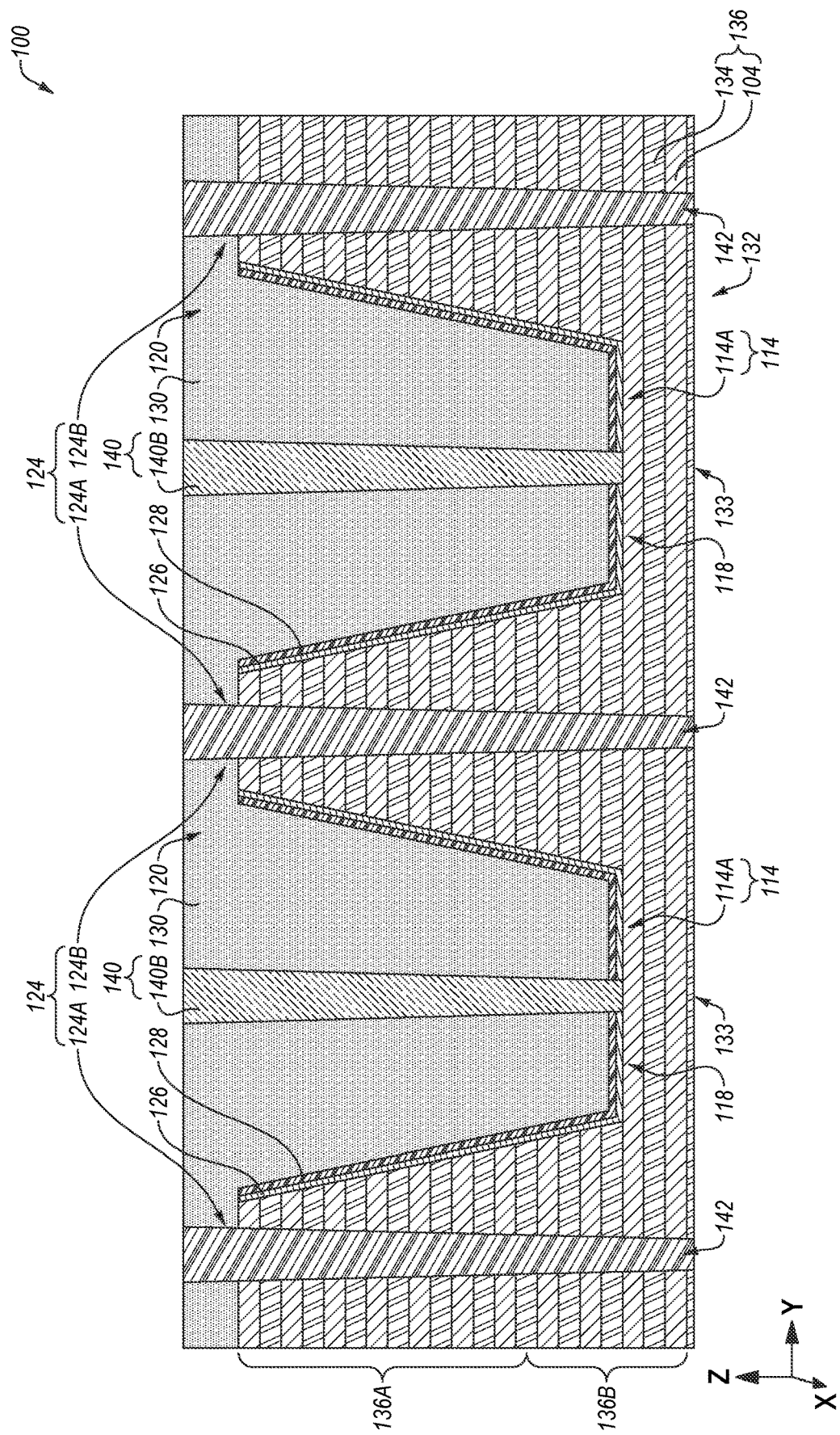
FIG. 4B is a simplified, longitudinal cross-sectional view of a portion of the microelectronic device structure at the processing stage of FIG. 4A about the dashed line B-B shown in FIG. 4A.

FIG. 4B is a simplified, longitudinal cross-sectional view of the microelectronic device structure 100 at the processing stage described above with reference to FIG. 4A, about the dashed line B-B illustrated in FIG. 4A. As shown in FIG. 4B, within each block 133 of the stack structure 132, the bridge regions 124 (including the first bridge region 124A and the second bridge region 124B) of the block 133 may horizontally intervene in the Y-direction between the stadium structures 114 (and, hence, the filled trenches 120) of the block 133 and filled slot structures 142 (e.g., dielectric-filled slots) horizontally neighboring the block 133 in the Y-direction. The filled slot structures 142 may comprise the slots 112 (FIG. 1A) filled with at least one dielectric material (e.g., at least one dielectric oxide material, such as $SiO_x$; at least one dielectric nitride material, such as $SiN_y$) following the formation of the stack structure 132 from the preliminary stack structure 102 (FIGS. 1A and 1B). Within each block 133 of the stack structure 132, the conductive material 134 of each tier 136 of the stack structure 132 having horizontal ends defining an individual stadium structure 114 may continuously horizontally extend in the X-direction across sides of the stadium structure 114 opposing one another in the Y-direction to form conductive paths extending from and between the crest regions 122 (FIG. 1A) of the block 133 horizontally neighboring the stadium structure 114 in the X-direction.

As shown in FIG. 4B, inner horizontal boundaries (e.g., inner sidewalls) of each of the bridge regions 124 (e.g., each of the first bridge regions 124A, each of the second bridge regions 124B) of each block 133 of the stack structure 132 may be oriented substantially non-perpendicular to uppermost vertical boundaries (e.g., uppermost surfaces) of the block 133. For example, the inner horizontal boundaries of the first bridge regions 124A of an individual block 133 may exhibit negative slope, and the inner horizontal boundaries of the second bridge regions 124B of the block 133 may exhibit positive slope. Horizontal widths in the Y-direction of each bridge region 124 (e.g., a first bridge region 124A and a second bridge region 124B) of a pair of bridge regions 124 horizontally neighboring an individual stadium structure 114 (e.g., a first stadium structure 114A) of the block 133 in the Y-direction may increase in the downward Z-direction (e.g., negative Z-direction) from an uppermost vertical boundary of the stadium structure 114 to a lowermost vertical boundary of the stadium structure 114. Accordingly, relatively vertically lower steps 118 of the stadium structure 114 may have relatively smaller (e.g., narrower) horizontal widths in the Y-direction than relatively vertically higher steps 118 of the stadium structure 114.

Still referring to FIG. 4B, the first dielectric material 126 may substantially cover and continuously extend across the inner horizontal boundaries (e.g., inner sidewalls, inner side surfaces) of each of the bridge regions 124 (e.g., each of the first bridge regions 124A, each of the second bridge regions 124B) of each block 133 of the stack structure 132. The first dielectric material 126 may also substantially cover and continuously extend across the boundaries (e.g., horizontal boundaries, vertical boundaries) of each stadium structure 114 within each block 133 of the stack structure 132. Furthermore, the second dielectric material 128 may at least partially (e.g., substantially) cover and continuously extend across the first dielectric material 126; and the third dielectric material 130 may substantially cover and continuously extend across the second dielectric material 128. In addition, within a horizontal area of each stadium structure 114, groups of the contact structures 140 may vertically extend through each of the third dielectric material 130, the second dielectric material 128, and the first dielectric material 126; and may land on (e.g., physically contact) at least some of the steps 118 of the stadium structure 114.

As shown in FIG. 4B, in some embodiments, for each of the blocks 133 of the stack structure 132, all of the second contact structures 140B are horizontally centered in at least the Y-direction on the steps 118 of the first stadium structure 114A in physical contact therewith. For example, a horizontal center in the Y-direction of each second contact structure 140B may be substantially aligned with a horizontal center in the Y-direction of the step 118 of the first stadium structure 114A that the second contact structure 140B physically contacts. In addition, a horizontal center in the X-direction of each second contact structure 140B may be substantially aligned with a horizontal center in the X-direction of the step 118 of the first stadium structure 114A that the second contact structure 140B physically contacts. In additional embodiments, for each of the blocks 133 of the stack structure 132, one or more of the second contact structures 140B are horizontally offset in the Y-direction from a horizontal center in the Y-direction of the step 118 of the first stadium structure 114A in physical contact therewith, and/or are horizontally offset in the X-direction from a horizontal center in the X-direction of the step 118 of the first stadium structure 114A in physical contact therewith. While not shown in FIG. 4B, horizontal positions of the first contact structures 140A (FIG. 4A) within a horizontal area of each of the blocks 133 of the stack structure 132 are described in further detail below with reference to FIGS. 4C and 4D.

Figure 4C:
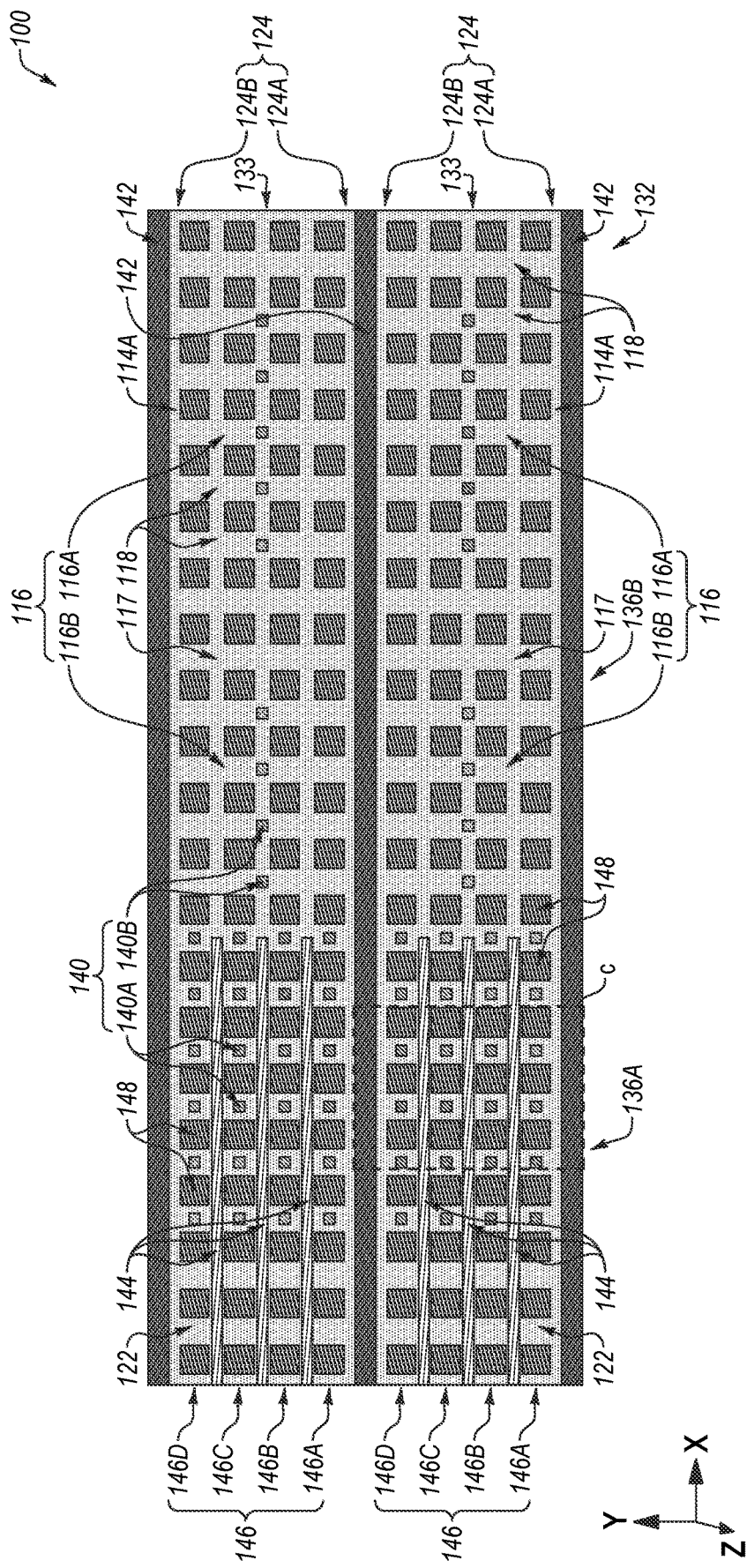
FIG. 4C is a simplified, partial top-down view of the microelectronic device structure at the processing stage of FIG. 4A.

FIG. 4C is a simplified, partial top-down view of the microelectronic device structure 100 at the processing stage described above with reference to FIGS. 4A and 4B. As shown in FIG. 4C, in addition to the features (e.g., structures, materials) previously described with reference to FIGS. 4A and 4B, the microelectronic device structure 100 is formed to further include additional filled slot structures 144 and support structures 148 (e.g., support contacts, support pillars). The additional filled slot structures 144 may be formed to vertically extend (e.g., in the Z-direction) partially through each block 133 of the stack structure 132, and may partially define and horizontally separate (e.g., in the Y-direction) upper select gate structures of each block 133 of the stack structure 132. In addition, the support structures 148 may vertically extend through (e.g., substantially through) individual blocks 133 of the stack structure 132.

Each block 133 of the stack structure 132 may individually have a desired distribution of the support structures 148 facilitating support of the insulative material 104 of each of the tiers 108 (FIGS. 1A and 1B) of the preliminary stack structure 102 (FIGS. 1A and 1B) during replacement of the sacrificial material 106 (FIGS. 1A and 1B) of each of the tiers 108 (FIGS. 1A and 1B) within the conductive material 134 (FIGS. 4A and 4B) to form the stack structure 132 (FIGS. 4A and 4B), as previously described herein with reference to FIG. 2. As shown in FIG. 4C, in some embodiments, each block 133 of the stack structure 132 includes at least one array of the support structures 148 vertically extending therethrough, including rows of the support structures 148 extending in the X-direction, and columns of the support structures 148 extending to the Y-direction. As a non-limiting example, the array of the support structures 148 may include at least two (2) rows (e.g., at least four (4) rows) of the support structures 148 each extending in the X-direction. In some embodiments, each block 133 of the stack structure 132 individually includes at least one array of the support structures 148 exhibiting at least four (4) rows of the support structures 148. For each block 133, portions of the at least one array of the support structures 148 may be located within horizontal areas of the stadium structures 114 within the block 133. As depicted in FIG. 4C, within horizontal areas of the stadium structures 114, the contact structures 140 may individually be positioned horizontally between support structures 148 horizontally neighboring one another in the X-direction. In addition, in some embodiments, some of the contact structures 140 (e.g., the second contact structures 140B) are also individually positioned horizontally between support structures 148 horizontally neighboring one another in the Y-direction.

The support structures 148 may each individually be formed to exhibit a desired horizontal cross-sectional shape. In some embodiments, each of the support structures 148 is formed to exhibit a substantially circular horizontal cross-sectional shape. In additional embodiments, one or more (e.g., each) of the support structures 148 exhibits a non-circular cross-sectional shape, such as one of more of a square cross-sectional shape, a rectangular cross-sectional shape, an oblong cross-sectional shape, an elliptical cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, and an irregular cross-sectional shape. In addition, each of the support structures 148 may be formed to exhibit substantially the same horizontal cross-sectional dimensions (e.g., substantially the same horizontal diameter), or at least one of the support structures 148 may be formed to exhibit one or more different horizontal cross-sectional dimensions (e.g., a different horizontal diameter) than at least one other of the support structures 148. In some embodiments, all of the support structures 148 are formed to exhibit substantially the same horizontal cross-sectional dimensions.

The support structures 148 may each individually be formed of and include at least one conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In addition, at least one dielectric liner material may be formed to substantially surround (e.g., substantially horizontally and vertically cover) sidewalls of each of the support structures 148. The dielectric liner material may be horizontally interposed between each of the support structures 148 and the tiers 136 (FIGS. 4A and 4B) (including the conductive material 134 and the insulative material 104 thereof) of the stack structure 132. The dielectric liner material may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric liner material comprises $SiO_2$.

Still referring to FIG. 4C, within each block 133 of the stack structure 132, the additional filled slot structures 144 may be formed to horizontally extend in parallel in the X-direction into a horizontal area of the first stadium structure 114A within the block 133. The additional filled slot structures 144 may, for example, individually horizontally extend in the X-direction through a crest region 122 of the block 133 horizontally neighboring the first stadium structure 114A and partially into a horizontal area of one of the opposing staircases structures 116 (e.g., the reverse staircase structure 116B) of the first stadium structure 114A. In some embodiments, each of the additional filled slot structures 144 horizontally terminates (e.g., horizontally ends) in the X-direction at or proximate a relatively lowest step 118 of the one of the opposing staircase structures 116 (e.g., the reverse staircase structure 116B) within vertical boundaries (e.g., in the Z-direction) of the relatively vertically higher tiers 136A of the stack structure 132. In addition, each of the additional filled slot structures 144 may vertically extend in the Z-direction to and terminate at or within vertical boundaries of a relatively lowest tier 136 of the relatively vertically higher tiers 136A of the stack structure 132. Within the block 133, horizontal ends of the relatively lowest tier 136 of the relatively vertically higher tiers 136A of the stack structure 132 may define the relatively lowest step 118 of the one of the opposing staircase structures 116 (e.g., the reverse staircase structure 116B).

Each additional filled slot structure 144 may comprise a slot (e.g., opening, trench, slit) in a block 133 of the stack structure 132 filled with at least one dielectric material. A material composition of the dielectric material of the additional filled slot structures 144 may be substantially the same as a material composition of the dielectric material of the filled slot structures 142, or the material composition of the dielectric material of the additional filled slot structures 144 may be different than the material composition of the dielectric material of the filled slot structures 142. In some embodiments, the additional filled slot structures 144 are formed of and include at least one dielectric oxide material (e.g., SiO$_x$, such as SiO$_2$).

Each block 133 of the stack structure 132 may include greater than or equal to one (1) of the additional filled slot structures 144 within a horizontal area thereof, such as greater than or equal to two (2) of the additional filled slot structures 144, or greater than or equal to three (3) of the additional filled slot structures 144. In some embodiments, each block 133 of the stack structure 132 includes three (3) of the additional filled slot structures 144 within a horizontal area thereof. The additional filled slot structures 144 may sub-divide each block 133 into at least two (2) sub-blocks 146. For example, as shown in FIG. 4C, if an individual block 133 includes three (3) of the additional filled slot structures 144 within a horizontal area thereof, the additional filled slot structures 144 may sub-divide the block 133 into four (4) sub-blocks 146, such as a first sub-block 146A, a second sub-block 146B, a third sub-block 146C, and a fourth sub-block 146D. For an individual block 133, portions of the conductive material 134 (FIGS. 4A and 4B) of each of the relatively vertically higher tiers 136A of the stack structure 132 within horizontal areas of the sub-blocks 146 of the block 133 may form upper select gate structures (e.g., SGD structures) of the block 133. For example, first portions of each of the relatively vertically higher tiers 136A of the stack structure 132 within horizontal boundaries of the first sub-block 146A may form first upper select gate structures of the block 133; second portions of each of the relatively vertically higher tiers 136A of the stack structure 132 within horizontal boundaries of the second sub-block 146B may form second upper select gate structures of the block 133; third portions of each of the relatively vertically higher tiers 136A of the stack structure 132 within horizontal boundaries of the third sub-block 146C may form third upper select gate structures of the block 133; and fourth portions of each of the relatively vertically higher tiers 136A of the stack structure 132 within horizontal boundaries of the fourth sub-block 146D may form fourth upper select gate structures of the block 133.

Still referring to FIG. 4C, for an individual block 133 of the stack structure 132, within horizontal areas of one of the crest regions 122 of the block 133 and one of the opposing staircase structures 116 (e.g., the reverse staircase structure 116B) of the first stadium structure 114A horizontally neighboring the crest region 122, the additional filled slot structures 144 may separate and isolate the upper select gate structures of each of the sub-blocks 146 of the block 133 from the upper select gate structures of each other of the sub-blocks 146 of the block 133. However, due to the bridge regions 124 (e.g., the first bridge regions 124A and the second bridge regions 124B) of the block 133 that horizontally extend from and between horizontally neighboring crest regions 122 of the block 133, some of the upper select gate structures of the block 133 may be shorted together within another of the crest regions 122 of the block 133 horizontally neighboring the other of the opposing staircase structures 116 (e.g., the forward staircase structure 116A) of the first stadium structure 114A. For example, for an individual block 133, the first upper select gate structures of the first sub-block 146A thereof may be shorted to the fourth upper select gate structures of the fourth sub-block 146D thereof by way of the bridge regions 124 extending from and between two (2) of the crest regions 122 of the block 133 horizontally neighboring the first stadium structure 114A. The first bridge region 124A horizontally neighboring a first side of the first stadium structure 114A may extend conductive paths of the first upper select gate structures of the first sub-block 146A around the first stadium structure 114A; and the second bridge region 124B horizontally neighboring a second, opposing side of the first stadium structure 114A may extend conductive paths of the forth upper select gate structures of the fourth sub-block 146D around the first stadium structure 114A. In turn, the conductive paths of the first upper select gate structures and the fourth upper select gate structures may converge within the crest region 122 that horizontally neighbors the first stadium structure 114A and that does not include the additional filled slot structures 144 therein, to short the first upper select gate structures to the forth upper select gate structures. Such shorting of upper select gate structures of the block 133 is resolved (e.g., broken, destroyed) through subsequent processing of the microelectronic device structure 100, as described in further detail below.

As shown in FIG. 4C, each sub-block 146 of an individual block 133 of the stack structure 132 may individually include a row of the first contact structures 140A. For example, if an individual block 133 is formed to include four (4) sub-blocks 146 (e.g., the first sub-block 146A, the second sub-block 146B, the third sub-block 146C, and the fourth sub-block 146D), each of the four (4) sub-blocks 146 may include one (1) row of the first contact structures 140A within a horizontal area thereof, such that the block 133 includes four (4) rows of the first contact structures 140A. Each row of the first contact structures 140A may horizontally extend in the X-direction, and may individually include a portion of the first contact structures 140A provided within a horizontal area of the block 133. In additional embodiments wherein an individual block 133 is sub-divided into a different number of sub-blocks 146, the block 133 may include a different number of rows of the first contact structures 140A equal to the different number of sub-blocks 146. In addition, as depicted in FIG. 4C, within an individual block 133 of the stack structure 132, columns of the first contact structures 140A may horizontally extend in the Y-direction. Each column of the first contact structures 140A may include first contact structures 140A provided within different sub-blocks 146 of the block 133 than one another.

Figure 4D:
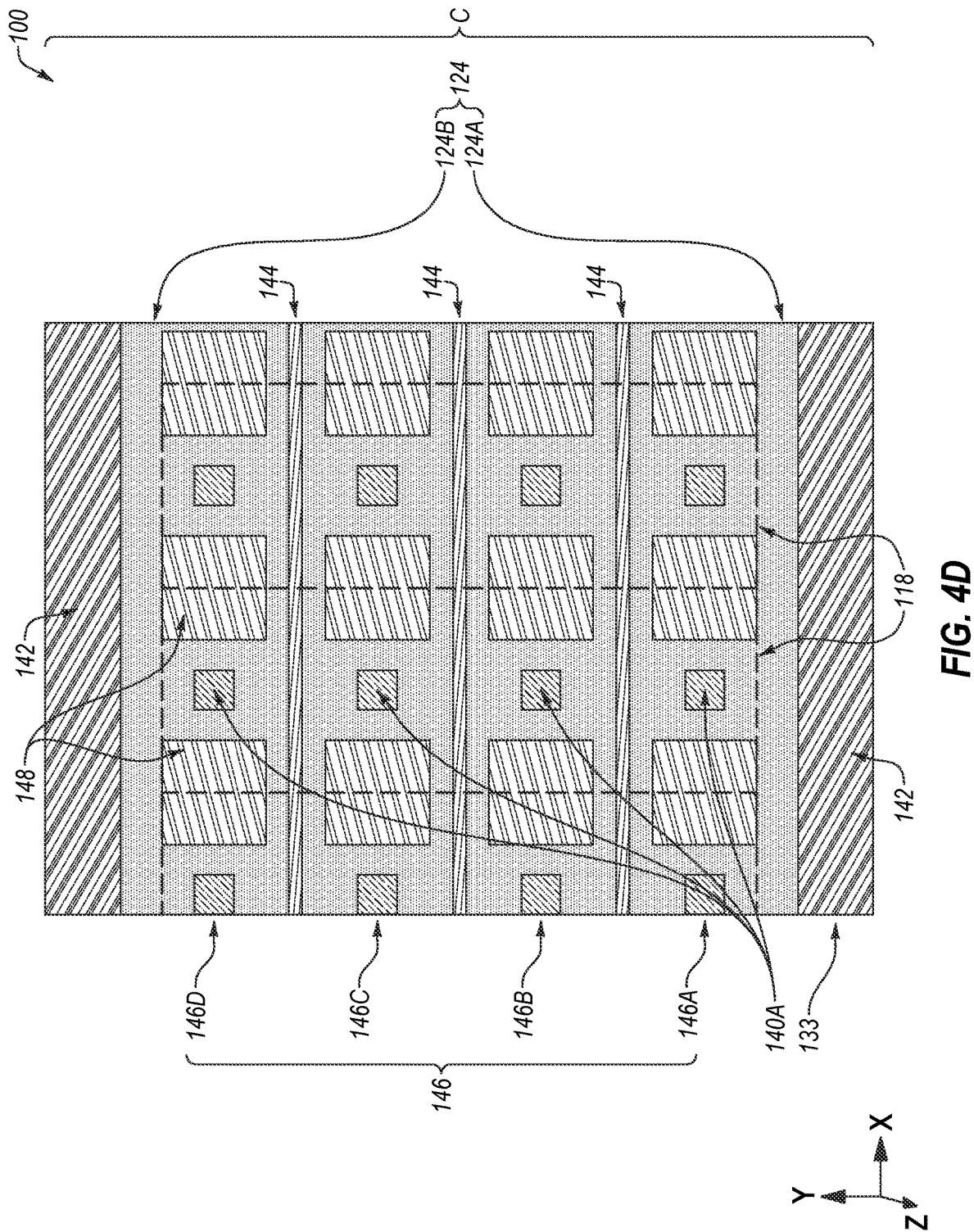
FIG. 4D shows a magnified view of a portion C (identified with dashed lines in FIG. 4C) of the simplified, partial top-down view of the microelectronic device structure shown in FIG. 4C.

For each sub-block 146 of an individual block 133 of the stack structure 132, the first contact structures 140A with a horizontal area of the sub-block 146 may be provided at desired horizontal positions (e.g., in the X-direction and the Y-direction) on the steps 118 of the first stadium structure 114A. Referring to FIG. 4D, which shows a magnified view of a portion C (identified with a dashed box in FIG. 4C) of the simplified, partial top-down view of the microelectronic device structure 100 depicted in FIG. 4C, in some embodiments, within an individual block 133 of the stack structure 132 (FIG. 4C), at least one of the rows of the first contact structures 140A is located horizontally closer to at least one of the additional filled slot structures 144 than at least one other of the rows of the first contact structures 140A. For example, a first row of the first contact structures 140A within a horizontal area of the first sub-block 146A may be positioned horizontally closer to one of the additional filled slot structures 144 horizontally interposed between the first sub-block 146A and the second sub-block 146B than a second row of the first contact structures 140A within a horizontal area of the second sub-block 146B. The first row of the first contact structures 140A may be positioned horizontally closer to the one of the additional filled slot structures 144 than to one of the filled slot structures 142 most proximate thereto. Put another way, a distance between the first row of the first contact structures 140A and the filled slot structure 142 most proximate thereto may be greater than a distance between the first row of the first contact structures 140A and the additional filled slot structure 144 most proximate thereto. As another example, a fourth row of the first contact structures 140A within a horizontal area of the fourth sub-block 146D may be positioned horizontally closer to one of the additional filled slot structures 144 horizontally interposed between the fourth sub-block 146D and the third sub-block 146C than a third row of the first contact structures 140A within a horizontal area of the third sub-block 146C. The fourth row of the first contact structures 140A may be positioned horizontally closer to the one of the additional filled slot structures 144 than to one of the filled slot structures 142 most proximate thereto. Put another way, a distance between the fourth row of the first contact structures 140A and the filled slot structure 142 most proximate thereto may be greater than a distance between the fourth row of the first contact structures 140A and the additional filled slot structure 144 most proximate thereto. Given the first bridge region 124A horizontally adjacent the first sub-block 146A and the second bridge region 124B horizontally adjacent the fourth sub-block 146D, forming the first row of the first contact structures 140A of the first sub-block 146A relatively closer to the additional filled slot structure 144 most proximate thereto may ensure each first contact structure 140A of the first row lands on one of the steps 118 of the first stadium structure 114A (FIG. 4C) (as opposed to on the first bridge region 124A); and forming the fourth row of the first contact structures 140A of the fourth sub-block 146D relatively closer to the additional filled slot structure 144 most proximate thereto may ensure each first contact structure 140A of the fourth row lands on one of the steps 118 of the first stadium structure 114A (FIG. 4C) (as opposed to on the second bridge region 124B).

With returned reference to FIG. 4C, each block 133 of the stack structure 132 may individually include a desired distribution of the second contact structures 140B within horizontal areas of the stadium structure 114. As shown in FIG. 4C, for an individual block 133 of the stack structure 132, the first stadium structure 114A may include at least one (1) row of the second contact structure 140B. Each row of the second contact structures 140B may horizontally extend in the X-direction, and may individually include a portion of the second contact structures 140B provided within a horizontal area of the block 133. For an individual block 133, the second contact structures 140B of each row may land on steps 118 of the first stadium structure 114A within vertical boundaries of the relatively vertically lower tiers 136B of the stack structure 132. In some embodiments, at least one of the opposing staircase structures 116 (e.g., the reverse staircase structure 116B and/or the forward staircase structure 116A) of the first stadium structure 114A includes a single (e.g., only one (1)) row of the second contact structures 140B within a horizontal area thereof. A horizontal centerline of the single row of the second contact structures 140B may be substantially aligned with a horizontal centerline of the block 133 (as depicted in FIG. 4C), or the horizontal centerline of the single row of the second contact structures 140B may be horizontally offset (e.g., in the Y-direction) from the horizontal centerline of the block 133. In additional embodiments, at least one of the opposing staircase structures 116 (e.g., the reverse staircase structure 116B and/or the forward staircase structure 116A) of the first stadium structure 114A includes more than one (1) row of the second contact structures 140B within a horizontal area thereof, such as at least two (2) rows of the second contact structures 140B, at least three (3) rows of the second contact structures 140B, or at least four (3) rows of the second contact structures 140B. In further embodiments, the second contact structures 140B are provided on steps 118 of the first stadium structure 114A in a different arrangement than in one or more of rows horizontally extending in the X-direction. For example, the second contact structure 140B may be arranged in a diagonal pattern extending substantially linearly in the X-direction and the Y-direction on steps 118 of the first stadium structure 114A, or may be arranged in an at least partially non-linear pattern (e.g., a curved pattern, a zigzag pattern, a random pattern, an irregular pattern) on steps 118 of the first stadium structure 114A.

Figure 5A:
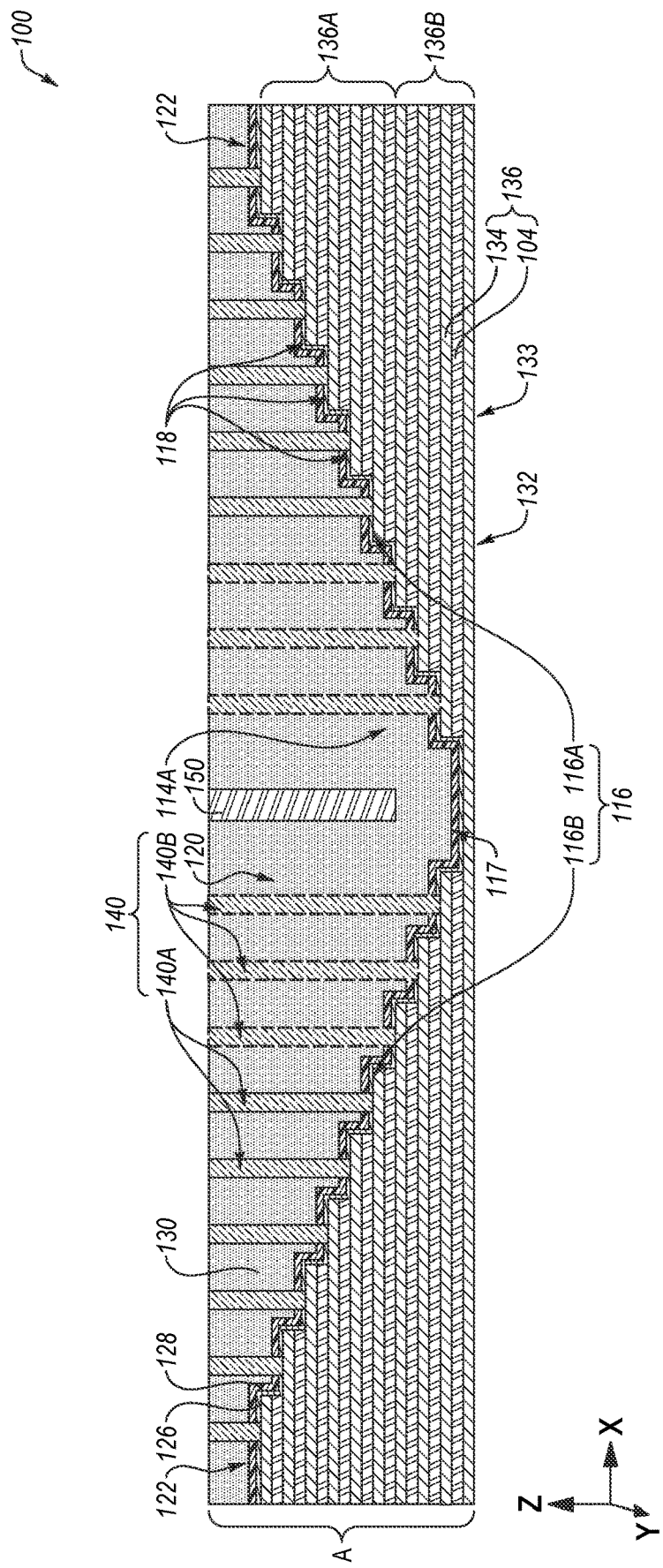
FIG. 5A is a simplified, longitudinal cross-sectional view of the portion A of the microelectronic device structure shown in FIGS. 1A and 1B at another processing stage of the method forming the microelectronic device following the processing stage of FIGS. 4A through 4D.
Figure 5B:
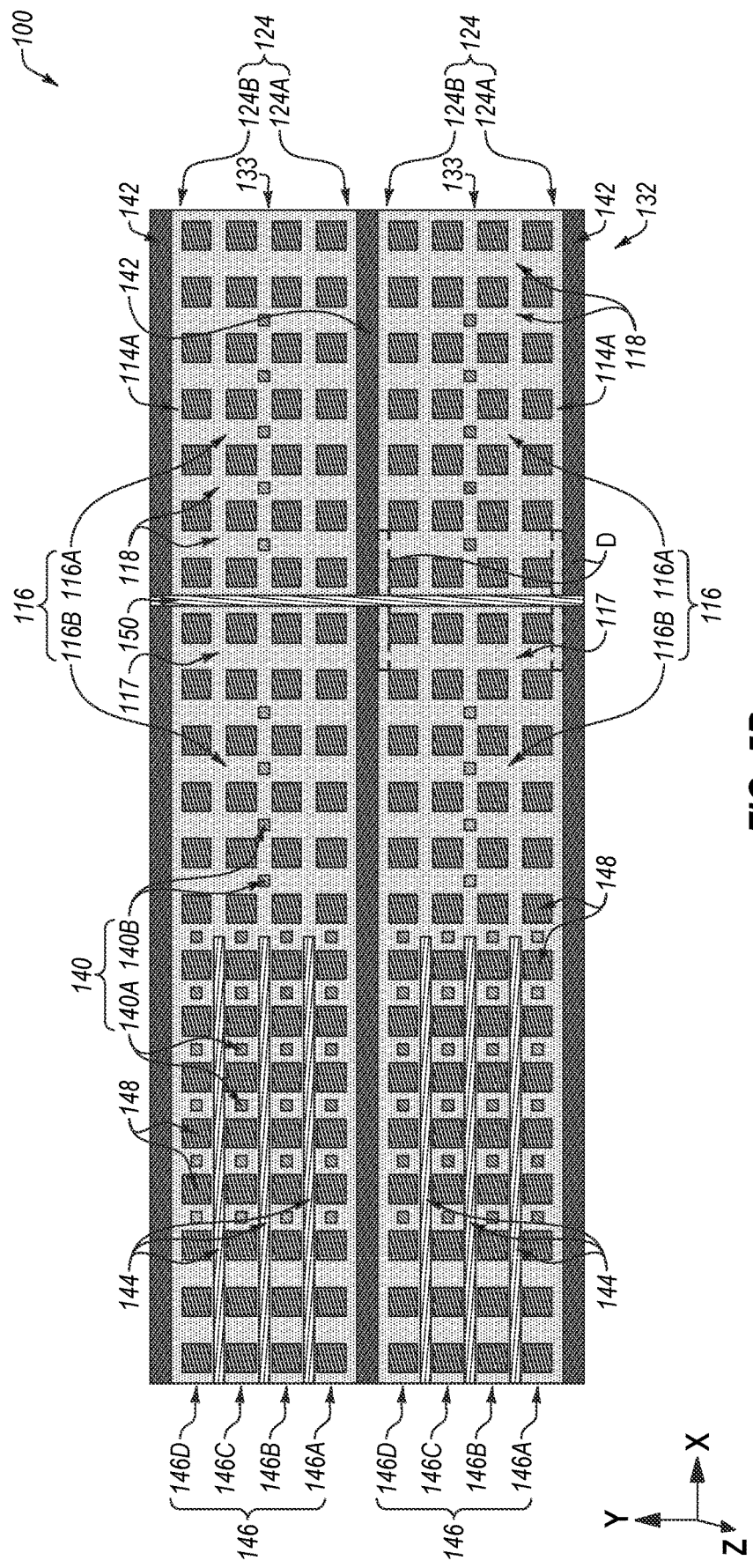
FIG. 5B is a simplified, partial top-down view of the microelectronic device structure at the processing stage of FIG. 5A.
Figure 5C:
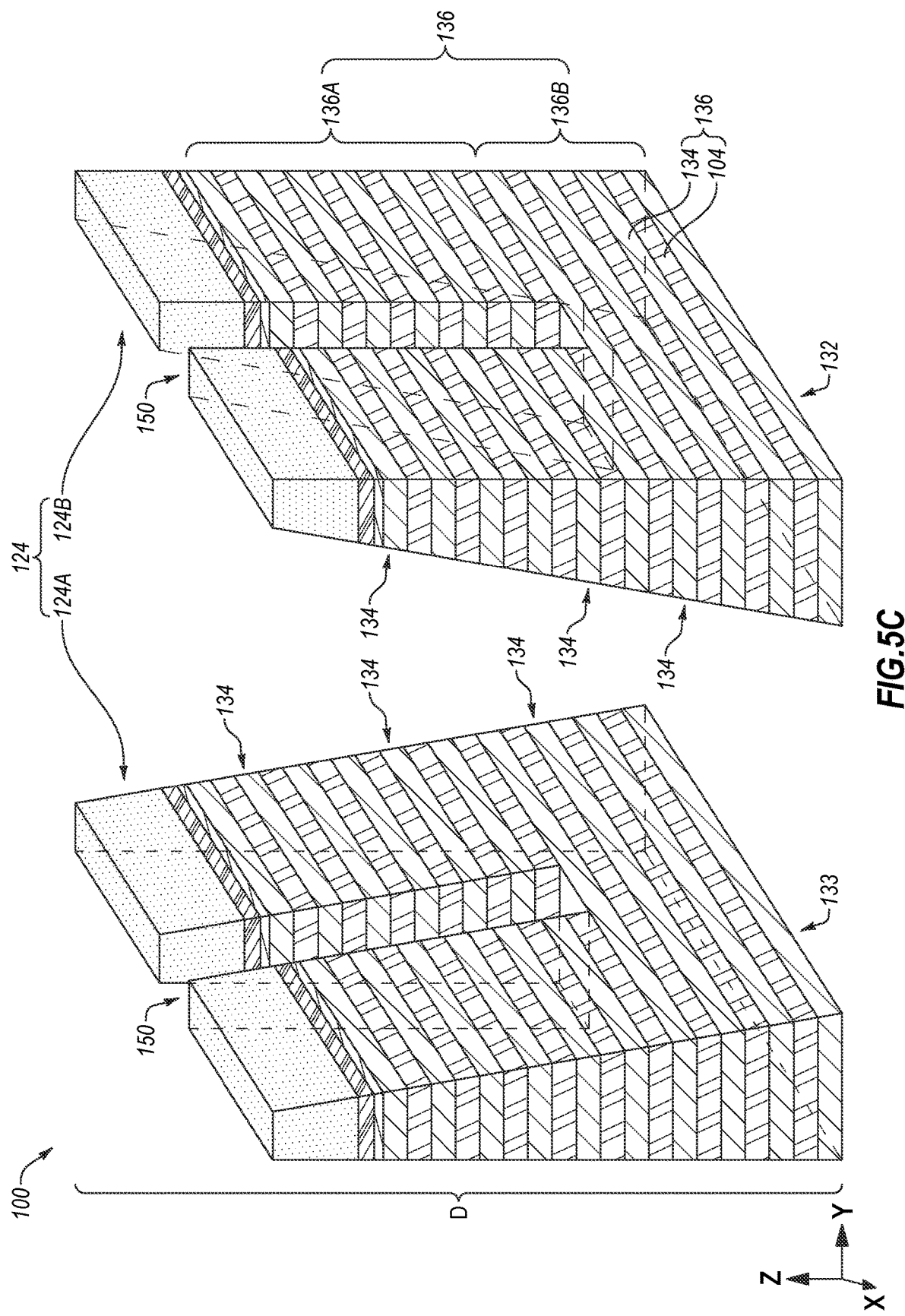
FIG. 5C is a simplified, partial perspective view of portions D (identified with dashed lines in FIG. 5B) of the microelectronic device structure shown in FIG. 5B.

Referring next to FIG. 5A, which is a simplified, longitudinal cross-sectional view of the portion A of the microelectronic device structure 100 following the processing stage previously described with reference to FIGS. 4A through 4D, at least one further filled slot structure 150 may be formed in the microelectronic device structure 100. For each block 133 of the stack structure 132, the further filled slot structure 150 may be positioned within horizontal boundaries in the X-direction of the first stadium structure 114A, may horizontally extend in the Y-direction through each of the bridge regions 124 (FIGS. 4B through 4D) horizontally neighboring the first stadium structure 114A in the Y-direction, and may at least partially vertically extend in the Z-direction through each of the bridge regions 124 (FIGS. 4B through 4D) horizontally neighboring the first stadium structure 114A. As described in further detail below, for each block 133 of the stack structure 132, the further filled slot structure 150 disrupts (e.g., breaks, destroys) at least some conductive paths extending from and between two (2) of the crest regions 122 horizontally neighboring (e.g., in the X-direction) the first stadium structure 114A by way of the bridge regions 124 (FIGS. 4B through 4D) horizontally neighboring (e.g., in the Y-direction) the first stadium structure 114A. FIG. 5B is a simplified, partial top-down view of the microelectronic device structure 100 at the processing stage depicted in FIG. 5A. FIG. 5C is a simplified, partial perspective view of portions D (identified with a dashed boxes in FIG. 5B) of the simplified, partial top-down view of the microelectronic device structure 100 depicted in FIG. 5B. For clarity and ease of understanding the drawings and related description, some features (e.g., structures, materials) of the microelectronic device structure 100 located within the boundaries of the portions D are not depicted in FIG. 5C to more clearly illustrate and emphasize other features of the microelectronic device structure 100 located within the boundaries of the portions D.

Each further filled slot structure 150 may comprise a slot (e.g., opening, trench, slit) in the microelectronic device structure 100 filled with at least one dielectric material. A material composition of the dielectric material of the further filled slot structure 150 may be substantially the same as a material composition of the dielectric material one or more (e.g., each) of the filled slot structures 142 (FIG. 5B) and the additional filled slot structures 144 (FIG. 5B), or the material composition of the dielectric material of the additional filled slot structures 144 may be different than the material composition of the dielectric material of one or more (e.g., each) of the filled slot structures 142 (FIG. 5B) and the additional filled slot structures 144 (FIG. 5B). In some embodiments, the further filled slot structure 150 is formed of and includes at least one dielectric oxide material (e.g., $SiO_x$, such as $SiO_2$). In additional embodiments, the further filled slot structure 150 is formed of and includes at least one dielectric nitride material (e.g., $SiN_y$, such as $Si_3N_4$).

With collective reference to FIGS. 5A through 5C, for each block 133 of the stack structure 132, each further filled slot structure 150 may vertically extend through and segment (e.g., partition) portions of the conductive material 134 (FIGS. 5A and 5C) of each of the relatively vertically higher tiers 136A (FIGS. 5A and 5C) of the stack structure 132 within horizontal areas of the bridge regions 124 (FIGS. 5B and 5C) horizontally neighboring the first stadium structure 114A (FIGS. 5A and 5B). The further filled slot structure 150 may segment first portions of the conductive material 134 (FIGS. 5A and 5C) of each of the relatively vertically higher tiers 136A within the first bridge region 124A horizontally neighboring a first side of the first stadium structure 114A (FIGS. 5A and 5B); and may also segment second portions of the conductive material 134 (FIGS. 5A and 5C) of each of the relatively vertically higher tiers 136A within the second bridge region 124B horizontally neighboring a second, opposing side of the first stadium structure 114A (FIGS. 5A and 5B). Thus, the further filled slot structure 150 may prevent shorting of first upper select gate structures of the first sub-block 146A (FIG. 5B) of the block 133 with fourth upper select gate structures of the fourth sub-block 146D (FIG. 5B) of the block 133. Namely, the further filled slot structure 150 may destroy conductive paths extending across the bridge regions 124 (FIGS. 5B and 5C) horizontally neighboring the first stadium structure 114A (FIGS. 5A and 5B) that may otherwise short the first upper select gate structures of the first sub-block 146A (FIG. 5B) to the fourth upper select gate structures of the fourth sub-block 146D (FIG. 5B) by way of third portions of the conductive material 134 (FIGS. 5A and 5C) of each of the relatively vertically higher tiers 136A within one of the crest regions 122 (e.g., a crest region 122 free of the additional filled slot structures 144) horizontally neighboring the first stadium structure 114A (FIGS. 5A and 5B).

In some embodiments, a lower vertical boundary of each further filled slot structure 150 is substantially coplanar with lower vertical boundaries of the additional filled slot structures 144 (FIG. 5B). For example, the further filled slot structure 150 may vertically extend in the Z-direction to and terminate at or within vertical boundaries of a relatively lowest tier 136 (FIGS. 5B and 5C) of the relatively vertically higher tiers 136A (FIGS. 5A and 5C) of the stack structure 132. In additional embodiments, a lower vertical boundary of the further filled slot structure 150 is vertically offset from (e.g., vertically underlies, vertically overlies) lower vertical boundaries of the additional filled slot structures 144 (FIG. 5B). The further filled slot structure 150 may vertically terminate at or below lower vertical boundaries of vertically lowest upper select gate structures (e.g., SGD structures) of an individual block 133 of the stack structure 132. The further filled slot structure 150 may vertically terminate at or above a relatively highest tier 136 (FIGS. 5B and 5C) of the relatively vertically lower tiers 136B (FIGS. 5B and 5C) of the stack structure 132. The further filled slot structure 150 may vertically terminate at or above upper vertical boundaries of vertically highest access line structure (e.g., word line structure) of an individual block 133 of the stack structure 132. As shown in FIG. 5A, for each block 133 of the stack structure 132, the further filled slot structure 150 may also at least partially vertically extend through the filled trench 120 (FIG. 5A) (including the third dielectric material 130, the second dielectric material 128, and the first dielectric material 126 thereof) neighboring the first stadium structure 114A (FIGS. 5A and 5B). In addition, in some embodiments, the further filled slot structure 150 also partially vertically extends through the one or more (e.g., each) of filled slot structures 142 (FIG. 5B) horizontally neighboring one or more of the blocks 133 of the stack structure 132.

By terminating the further filled slot structure 150 may vertically terminate at or above a relatively highest tier 136 (FIGS. 5B and 5C) of the relatively vertically lower tiers 136B (FIGS. 5B and 5C) of the stack structure 132, some conductive paths extending from and between the crest regions 122 (FIG. 1A) neighboring the first stadium structure 114A of an individual block 133 of the stack structure 132 may be maintained (e.g., may not be disrupted) following the formation of the further filled slot structure 150. For example, for an individual block 133 of the stack structure 132, portions of the conductive material 134 of the relatively vertically lower tiers 136B (FIGS. 5B and 5C) of the stack structure 132 within horizontal boundaries of the bridge regions 124 (e.g., the first bridge region 124A, the second bridge region 124B) may not be segmented by the further filled slot structure 150. Thus, conductive paths of access line structures (e.g., word line structure) formed by the conductive material 134 of the relatively vertically lower tiers 136B (FIGS. 5B and 5C) may continue to extend around the first stadium structure 114A (and the filled trench 120 associated therewith) by way of the bridge regions 124 neighboring first stadium structure 114A. As a result, for an individual block 133 of the stack structure 132, an individual (e.g., single) switching device (e.g., transistor) of a string driver device coupled to the conductive material 134 of an individual relatively vertically lower tier 136B may be employed to drive voltages completely across and/or in opposing directions across the relatively vertically lower tier 136B. Accordingly, the structures and methods of the disclosure may decrease the number of switching devices and/or routing structures required to effectively operate a microelectronic device (e.g., a memory device), and may increase one or more of microelectronic device performance, scalability, efficiency, and simplicity as compared to conventional structures and methods.

In some embodiments, for an individual block 133 of the stack structure, at least some of the second contact structures 140B on the steps 118 of the first stadium structure 114A are employed to ensure continuity of conductive paths formed by the conductive material 134 of the relatively vertically lower tiers 136B (FIGS. 5B and 5C) between the crest regions 122 (FIG. 1A) neighboring the first stadium structure 114A. For example, one or more conductive routing structures may be employed to couple one of the second contact structures 140B on a step 118 of the reverse staircase structure 116B of the first stadium structure 114A to another one of the second contact structure 140B on a counterpart step 118 (e.g., a step at substantially the same vertical position in the stack structure 132) of the forward staircase structure 116A of the first stadium structure 114A. The conductive routing structure(s) may, for example, be formed over, in contact with, and between each of the one of second contact structures 140B and the another one of second contact structures 140B. Accordingly, for an individual block 133 of the stack structure 132, a conductive path of an access line structure (e.g., word line structure) formed by the conductive material 134 of an individual relatively vertically lower tier 136B (FIGS. 5B and 5C) may extend around the first stadium structure 114A (and the filled trench 120 associated therewith) by way of at least two (2) of the second contact structures 140B coupled to the conductive material 134 at two (2) opposing steps 118 of the first stadium structure 114A and the conductive routing structure(s) coupled to the at least two (2) of the second contact structures 140B.

Referring to FIG. 5B, each further filled slot structure 150 may be formed to exhibit a desired horizontal geometric configuration (e.g., horizontal cross-sectional shape, and horizontal dimensions) facilitating segmentation of the bridge regions 124 horizontally neighboring the first stadium structures 114A of individual blocks 133 of the stack structure 132. In some embodiments, each further filled slot structure 150 is formed to exhibit an oblong horizontal cross-sectional shape, such as a rectangular cross-sectional shape. For an individual block 133 of the stack structure 132, the further filled slot structure 150 may horizontally extend in the Y-direction completely across the bridge regions 124 horizontally neighboring the first stadium structures 114A. In some embodiments, the further filled slot structure 150 substantially continuously horizontally extends in the Y-direction across at least a maximum width in the Y-direction of an individual block 133 of the stack structure 132. The further filled slot structure 150 may substantially continuously horizontally extend in the Y-direction within and across a single (e.g., only one) block 133 of the stack structure 132, or the further filled slot structure 150 may substantially continuously horizontally extend in the Y-direction within and across multiple (e.g., more than one) blocks 133 of the stack structure 132. In some embodiments, the further filled slot structure 150 substantially continuously horizontally extends in the Y-direction within and across multiple blocks 133 of the stack structure 132, as well as within and across the filled slot structure(s) 142 horizontally interposed between the multiple blocks 133.

Referring collectively to FIGS. 5A through 5C, each further filled slot structure 150 may be formed at a desired horizontal position in the X-direction facilitating segmentation of the bridge regions 124 horizontally neighboring the first stadium structure 114A (FIGS. 5A and 5B) of individual blocks 133 of the stack structure 132. For example, as shown in FIGS. 5A and 5B, in some embodiments, the further filled slot structure 150 is formed to be positioned within horizontal boundaries in the X-direction of the central region 117 of the first stadium structure 114A within one or more of the blocks 133 of the stack structure 132. The filled slot structure 150 may be formed to be substantially aligned within a center of the central region 117 of the first stadium structure 114A in the X-direction, or may be formed to the horizontally offset from the center of the central region 117 of the first stadium structure 114A in the X-direction. In additional embodiments, the further filled slot structure 150 may be formed at a different horizontal position within horizontal boundaries in the X-direction of the first stadium structure 114A (FIGS. 5A and 5B) of one or more of the blocks 133 of the stack structure 132, as described in further detail below.

The further filled slot structure 150 may be formed by subjecting the microelectronic device structure 100 following the processing stage previously described with reference to FIGS. 4A through 4D to at least one material removal process (e.g., anisotropic etching process such as one or more of RIE, deep RIE, plasma etching, reactive ion beam etching, and chemically assisted ion beam etching) to form at least one slot having a horizontal position and geometric configuration corresponding to that of the further filled slot structure 150 to be formed. Thereafter, dielectric material may be formed (e.g., non-conformably deposited) inside and outside of the slot, and then portions of the dielectric material outside of boundaries (e.g., horizontal boundaries, vertical boundaries) of the slot may be removed (e.g., through an abrasive planarization process, such as a CMP process) to form the further filled slot structure 150.

Thus, in accordance with embodiments of the disclosure, a microelectronic device comprises a stack structure comprising a vertically alternating sequence of conductive material and insulative material arranged in tiers. The stack structure has blocks separated from one another by first dielectric slot structures. Each of the blocks comprises two crest regions, a stadium structure interposed between the two crest regions in a first horizontal direction and comprising opposing staircase structures each having steps comprising edges of the tiers of the stack structure, and two bridge regions neighboring opposing sides of the stadium structure in a second horizontal direction orthogonal to the first horizontal direction and having upper surfaces substantially coplanar with upper surfaces of the two crest regions. The microelectronic device further comprises at least one second dielectric slot structure within horizontal boundaries of the stadium structure in the first horizontal direction and partially vertically extending through and segmenting each of the two bridge regions.

Furthermore, in accordance with embodiments of the disclosure, a method of forming a microelectronic device comprises forming a preliminary stack structure comprising a vertically alternating sequence of sacrificial material and insulative material arranged in tiers. The preliminary stack structure has blocks separated from one another by slots. Each of the blocks comprises two crest regions, two bridge regions horizontally extending in parallel from and between the two crest regions and having upper boundaries substantially coplanar with upper boundaries of the two crest regions, two bridge regions horizontally extending in parallel from and between the two crest regions and having upper boundaries substantially coplanar with upper boundaries of the two crest regions, and a stadium structure interposed between the two crest regions in a first horizontal direction and interposed between the two bridge regions in a second horizontal direction orthogonal to the first horizontal direction. The stadium structure comprises opposing staircase structures each having steps comprising edges of the tiers of the preliminary stack structure. The sacrificial material of the preliminary stack structure is replaced with conductive material to form a stack structure comprising a vertically alternating sequence of the conductive material and the insulative material arranged in the tiers. The stack structure has the blocks separated from one another by the slots. The slots are filled with dielectric material to form first dielectric slot structures. At least one second dielectric slot structure is formed within horizontal boundaries of the stadium structure in the first horizontal direction and partially vertically extends through and segments each of the two bridge regions.

As previously described, the microelectronic device structure 100 may be formed to exhibit a different configuration than that illustrated in FIGS. 5A through 5C. By way of non-limiting example, FIGS. 6 through 9 show simplified, partial top-down views of additional microelectronic device structures formed through methods of the disclosure to have different configurations than the microelectronic device structure 100 (FIGS. 5A through 5C), in accordance with additional embodiments of the disclosure. Throughout the remaining figures (i.e., FIGS. 6 through 11) and the associated description, functionally similar features (e.g., structures, materials) are referred to with similar reference numerals incremented by 100. To avoid repetition, not all features shown in the remaining figures (i.e., FIGS. 6 through 11) are described in detail herein. Rather, unless described otherwise below, a feature designated by a reference numeral that is a 100 increment of the reference numeral of a previously described feature (whether the previously-described feature is first described before the present paragraph, or is first described after the present paragraph) will be understood to be substantially similar to the previously described feature. By way of non-limiting example, unless described otherwise below, features designated by the reference numerals 244, 344, 444, 544, 644 in FIGS. 6 through 10 will be understood to be substantially similar to the additional filled slot structures 144 previously described herein with reference to FIGS. 4C, 4D, and 5B.

Figure 6:
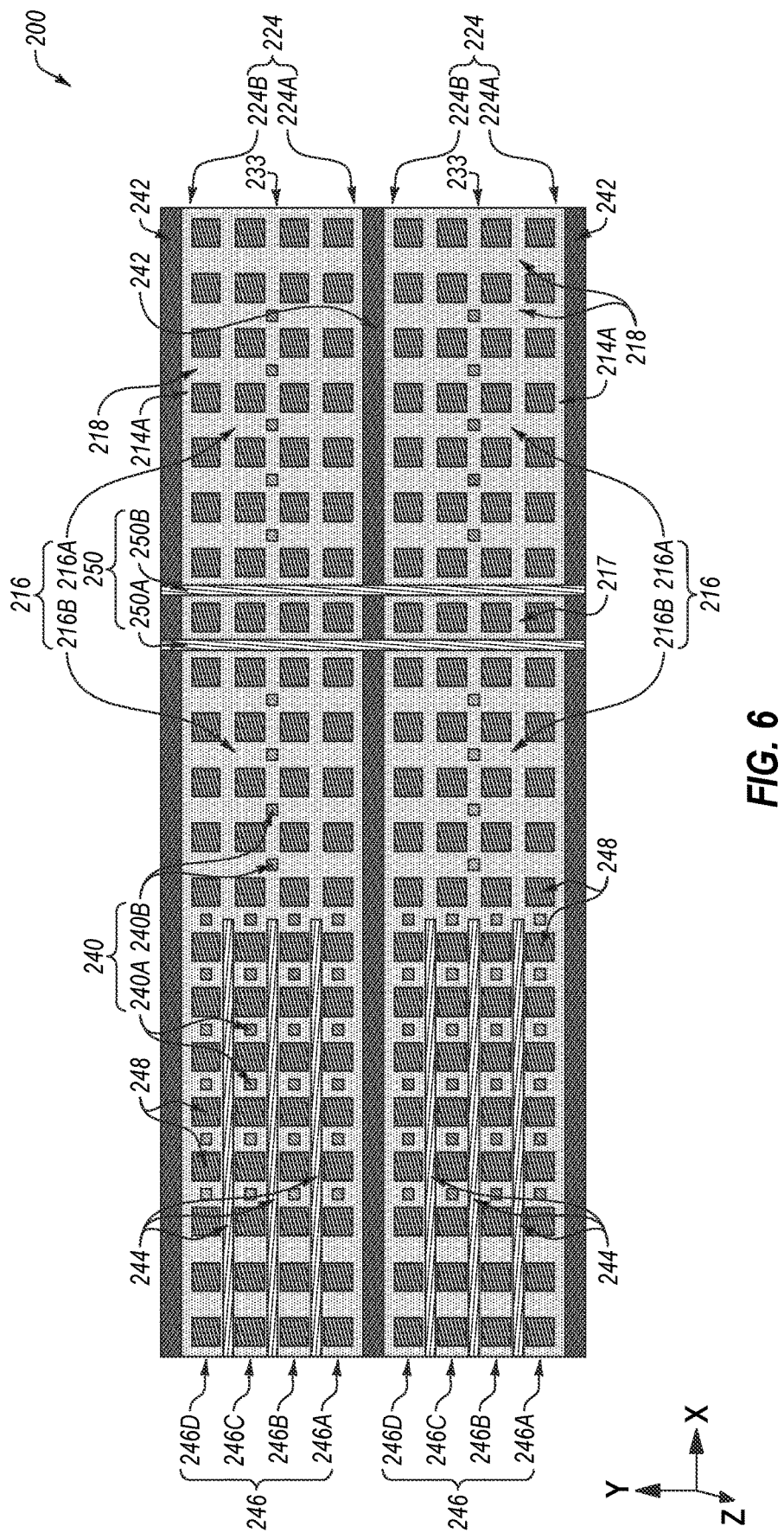
FIG. 6 is a simplified, partial top-down view of a microelectronic device structure at a processing stage of a method forming a microelectronic device, in accordance with additional embodiments of the disclosure.

FIG. 6 illustrates a simplified, partial top-down view of a microelectronic device structure 200 at a processing stage of a method of forming a microelectronic device (e.g., a memory device, such as a 3D NAND Flash memory device), in accordance with additional embodiments of the disclosure. As shown in FIG. 6, the microelectronic device structure 200 is formed to be similar to the microelectronic device structure 100 at the processing stage previously described with reference to FIGS. 5A through 5C, except that the microelectronic device structure 200 is formed to include multiple (e.g., more than one) further filled slot structures 250 horizontally extending in parallel within one another in the Y-direction. For example, the microelectronic device structure 200 may be formed to include a first filled slot structure 250A horizontally extending in the Y-direction, and a second filled slot structure 250B horizontally neighboring the first filled slot structure 250A in the X-direction and also horizontally extending in the Y-direction. As shown in FIG. 6, in some embodiments, each of the further filled slot structures 250 (e.g., the first filled slot structure 250A, the second filled slot structure 250B) is formed to exhibit substantially the same geometric configuration (e.g., substantially the same shape, substantially the same dimensions) as each other of the further filled slot structures 250. In additional embodiments, at least one of the further filled slot structures 250 is formed to exhibit a different geometric configuration (e.g., a different shape, one or more different dimensions) than at least one other of the further filled slot structures 250. Furthermore, in some embodiments, each of the further filled slot structures 250 is formed to be positioned within horizontal boundaries in the X-direction of the central region 217 of the first stadium structure 214A within one or more of the blocks 233 of the stack structure 232. In additional embodiments, at least one of the further filled slot structures 250 is formed to be positioned outside of the horizontal boundaries in the X-direction of the central region 217 of the first stadium structure 214A within one or more of the blocks 233 of the stack structure 232.

Figure 7:
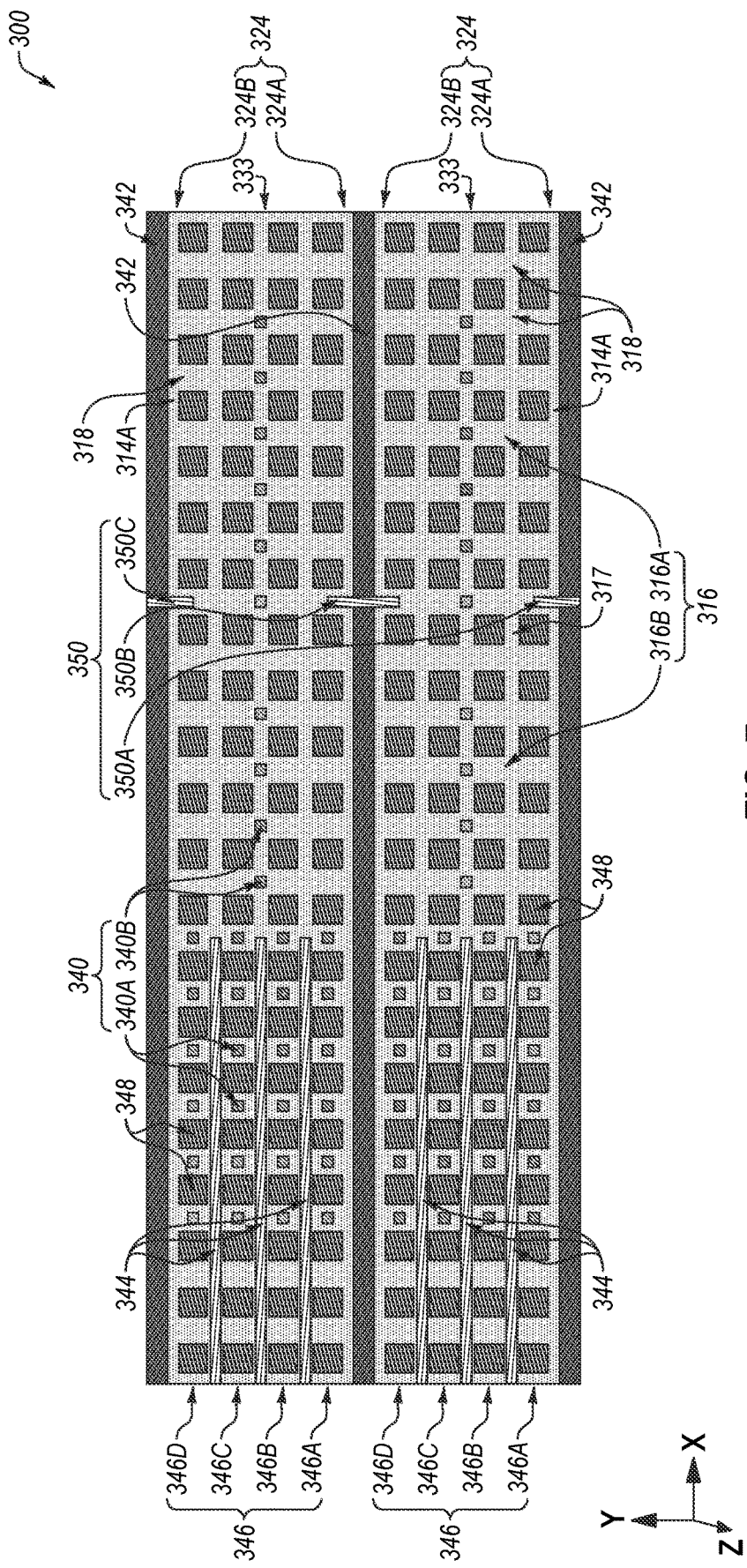
FIG. 7 is a simplified, partial top-down view of a microelectronic device structure at a processing stage of a method forming a microelectronic device, in accordance with yet additional embodiments of the disclosure.

FIG. 7 illustrates a simplified, partial top-down view of a microelectronic device structure 300 at a processing stage of a method of forming a microelectronic device (e.g., a memory device, such as a 3D NAND Flash memory device), in accordance with additional embodiments of the disclosure. As shown in FIG. 7, the microelectronic device structure 300 is formed to be similar to the microelectronic device structure 100 at the processing stage previously described with reference to FIGS. 5A through 5C, except that the microelectronic device structure 300 is formed to include multiple (e.g., more than one) further filled slot structures 350 horizontally extending in series with one another in the Y-direction. For example, the microelectronic device structure 300 may be formed to include a first further filled slot structure 350A, a second further filled slot structure 350B, and a third further filled slot structure 350C each horizontally extending in series with one another in the Y-direction. Each further filled slot structure 350 may vertically extend (e.g., in the Z-direction) and horizontally extend (e.g., in the Y-direction) through at least one of the bridge regions 324 (e.g., a first bridge region 324A, a second bridge region 324B) horizontally neighboring the first stadium structure 314A within at least one of the blocks 333 of the stack structure 332. The further filled slot structures 350 may together effectively form a discontinuous (e.g., segmented) slot structure in the microelectronic device structure 300.

For an individual block 333 of the stack structure 332, at least two (2) of the further filled slot structures 350 may extend through and segment (e.g., partition) portions of the conductive material (e.g., corresponding to the conductive material 134 (FIGS. 5A and 5C)) of each of the relatively vertically higher tiers (e.g., corresponding to the relatively vertically higher tiers 136A (FIGS. 5A and 5C)) of the stack structure 332 within horizontal areas of the bridge regions 324 horizontally neighboring the first stadium structure 314A. In some embodiments, the first further filled slot structure 350A extends through and segments a first bridge region 324A of a first of the blocks 333; the second further filled slot structure 350B extends through and segments a second bridge region 324B of the first of the blocks 333 and a first bridge region 324A of a second of the blocks 333; and the third further filled slot structure 350C extends through and segments a second bridge region 324B of the second of the blocks 333. Each of the further filled slot structures 350 may also extend (e.g., horizontally extend, vertically extend) through one of the filled slot structures 342 horizontally interposed between horizontally neighboring blocks 333 of the stack structure 332, or at least one of the further filled slot structures 350 may be substantially confined within a horizontal area of one of the blocks 333.

As shown in FIG. 7, in some embodiments, the further filled slot structures 350 (e.g., the first further filled slot structure 350A, the second further filled slot structure 350B, and the further third filled slot structure 350C) are substantially aligned with one another in the X-direction. In additional embodiments, at least one of the further filled slot structures 350 is horizontally offset in the X-direction from at least one other of the further filled slot structures 350.

Figure 8:
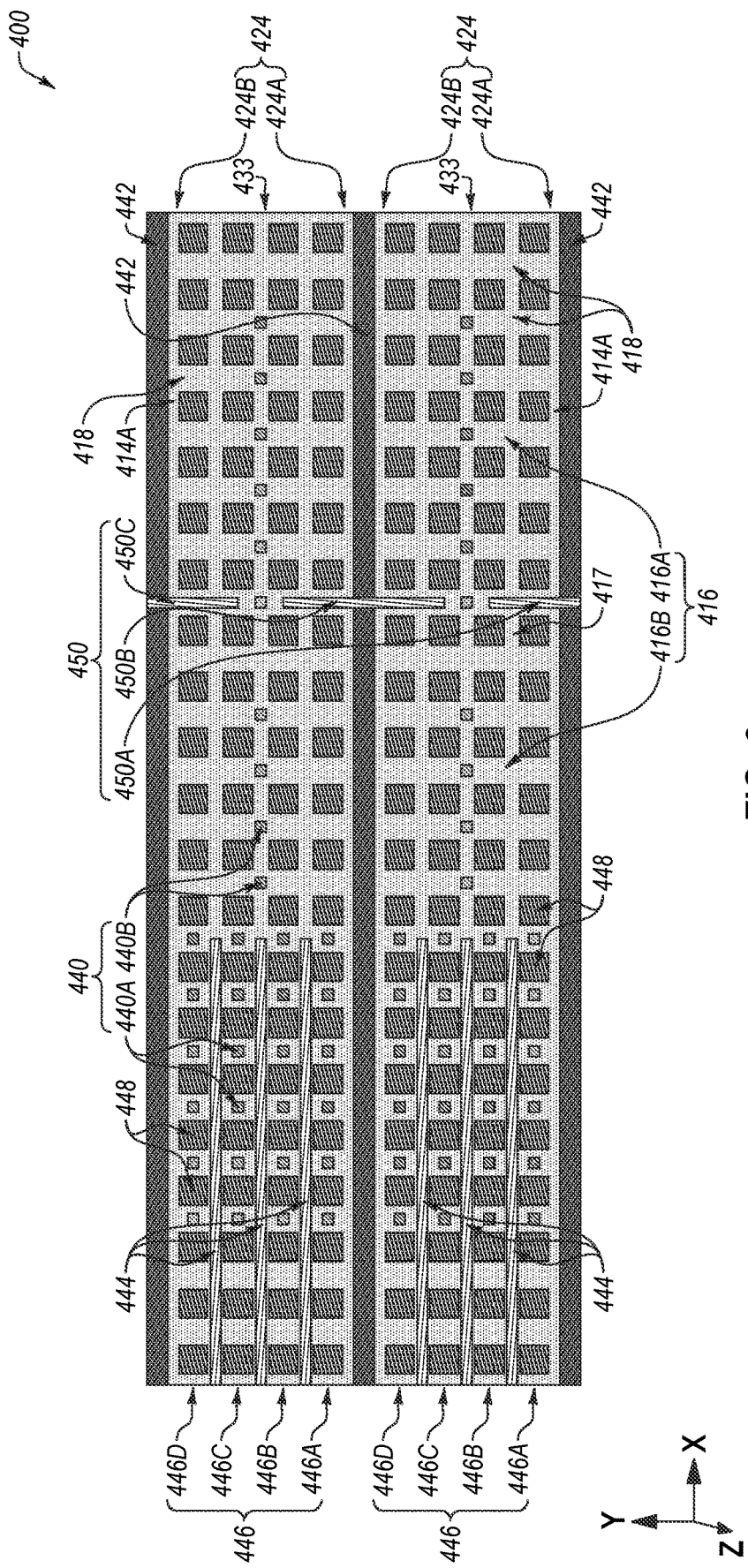
FIG. 8 is a simplified, partial top-down view of a microelectronic device structure at a processing stage of a method forming a microelectronic device, in accordance with further embodiments of the disclosure.

FIG. 8 illustrates a simplified, partial top-down view of a microelectronic device structure 400 at a processing stage of a method of forming a microelectronic device (e.g., a memory device, such as a 3D NAND Flash memory device), in accordance with additional embodiments of the disclosure. As shown in FIG. 8, the microelectronic device structure 400 is formed to be similar to the microelectronic device structure 100 at the processing stage previously described with reference to FIGS. 5A through 5C, except that the microelectronic device structure 300 is formed to include multiple (e.g., more than one) further filled slot structures 450 horizontally extending in series with one another in the Y-direction, and the further filled slot structures 450 are positioned outside of horizontal boundaries in the X-direction of the central region 417 of the first stadium structure 414A of each block 433 of the stack structure 432. For example, the microelectronic device structure 400 may be formed to include a first further filled slot structure 450A, a second further filled slot structure 450B, and a third further filled slot structure 450C each horizontally extending in series with one another in the Y-direction and each positioned within horizontal boundaries in the X-direction of one of the opposing staircase structures 416 (e.g., the forward staircase structure 416A) of the first stadium structure 414A of individual blocks 433 of the stack structure 432. Each further filled slot structure 450 may vertically extend (e.g., in the Z-direction) and horizontally extend (e.g., in the Y-direction) through at least one of the bridge regions 424 (e.g., a first bridge region 424A, a second bridge region 424B) horizontally neighboring the first stadium structure 414A within at least one of the blocks 433 of the stack structure 432. The further filled slot structures 450 may together effectively form a discontinuous (e.g., segmented) slot structure in the microelectronic device structure 400.

For an individual block 433 of the stack structure 432, at least two (2) of the further filled slot structures 450 may extend through and segment (e.g., partition) portions of the conductive material (e.g., corresponding to the conductive material 134 (FIGS. 5A and 5C)) of each of the relatively vertically higher tiers (e.g., corresponding to the relatively vertically higher tiers 136A (FIGS. 5A and 5C)) of the stack structure 432 within horizontal areas of the bridge regions 424 horizontally neighboring the first stadium structure 414A. In some embodiments, the first further filled slot structure 450A extends through and segments a first bridge region 424A of a first of the blocks 433; the second further filled slot structure 450B extends through and segments a second bridge region 424B of the first of the blocks 433 and a first bridge region 424A of a second of the blocks 433; and the third further filled slot structure 450C extends through and segments a second bridge region 424B of the second of the blocks 433. Each of the further filled slot structures 450 may also extend (e.g., horizontally extend, vertically extend) through one of the filled slot structures 442 horizontally interposed between horizontally neighboring blocks 433 of the stack structure 432, or at least one of the further filled slot structures 450 may be substantially confined within a horizontal area of one of the blocks 433.

As shown in FIG. 8, the further filled slot structures 450 may be formed at least partially within horizontal boundaries in the X-direction of one or more relatively vertically lower (e.g., vertically lowest) steps 418 of the first stadium structure 414A within individual blocks 433 of the stack structure 432. For example, the first further filled slot structure 450A, the second further filled slot structure 450B, and the third further filled slot structure 450C may each be positioned within horizontal boundaries in the X-direction of vertically lower steps 418 (e.g., steps 418 most vertically proximate the central regions 417) of the forward staircase structures 416A of horizontally neighboring blocks 433 of the stack structure 432. For individual blocks 433 of the stack structure 432, one or more of the second contact structures 440B may be horizontally interposed in the Y-direction between further filled slot structures 450 horizontally neighboring one another in the Y-direction. For example, at least one of the second contact structures 440B on one of the steps 418 of the first stadium structure 414A within a first of the blocks 433 may be horizontally interposed between the first further filled slot structure 450A and the second further filled slot structure 450B; and at least one of the second contact structures 440B on one of the steps 418 of the first stadium structure 414A within a second of the blocks 433 may be horizontally interposed between the second further filled slot structure 450B and the third further filled slot structure 450C.

In some embodiments, the further filled slot structures 450 (e.g., the first further filled slot structure 450A, the second further filled slot structure 450B, and the further third filled slot structure 450C) are substantially aligned with one another in the X-direction. In additional embodiments, at least one of the further filled slot structures 450 is horizontally offset in the X-direction from at least one other of the further filled slot structures 450. In addition, as shown in FIG. 8, the further filled slot structures 450 may each be substantially aligned with two (2) or more of the second contact structures 440B substantially aligned with one another in the X-direction. In additional embodiments, at least one of the further filled slot structures 450 is horizontally offset in the X-direction from at least one of the second contact structures 440B most proximate thereto in the Y-direction.

Figure 9:
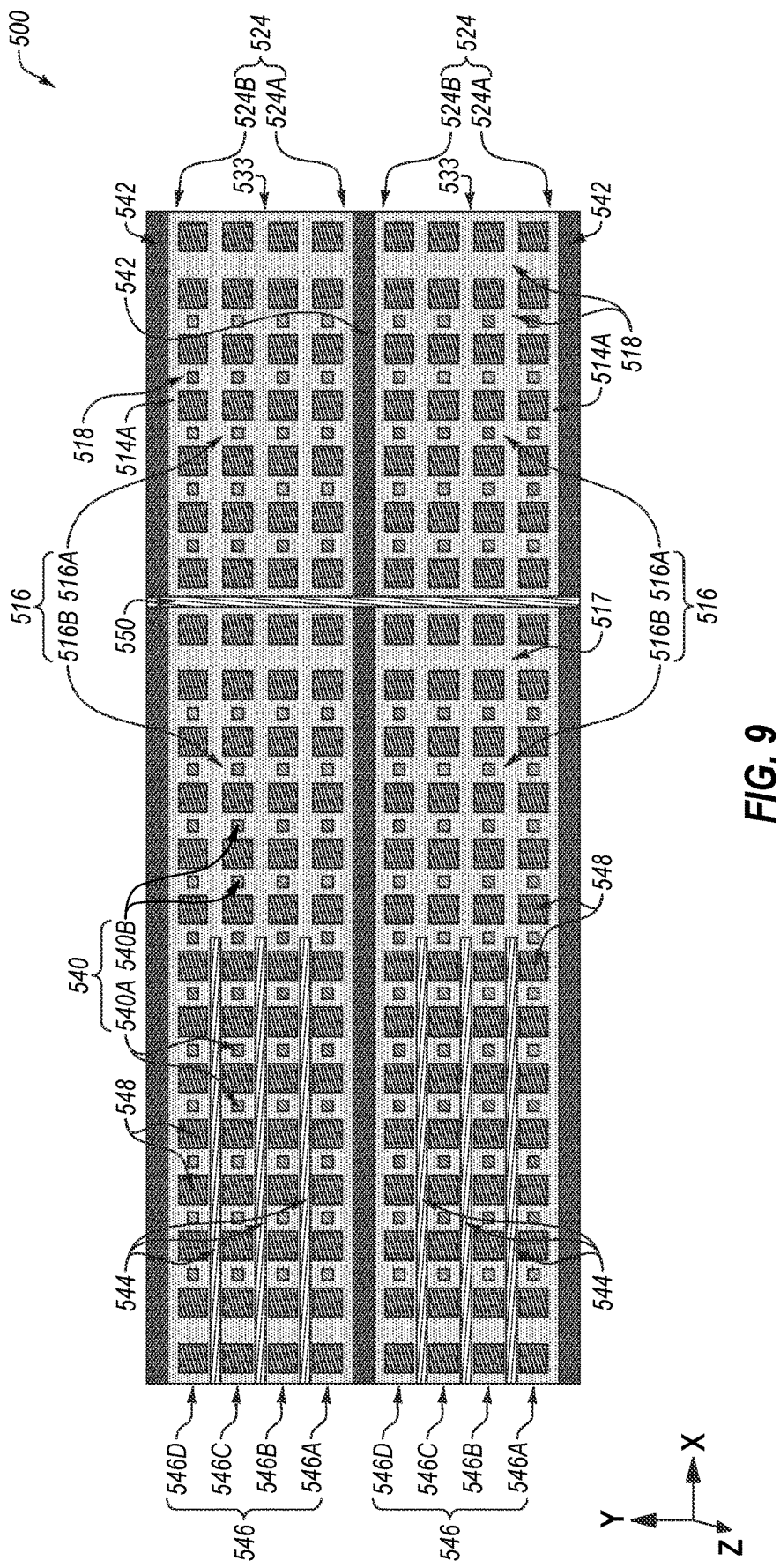
FIG. 9 is a simplified, partial top-down view of a microelectronic device structure at a processing stage of a method forming a microelectronic device, in accordance with yet further embodiments of the disclosure.

FIG. 9 illustrates a simplified, partial top-down view of a microelectronic device structure 500 at a processing stage of a method of forming a microelectronic device (e.g., a memory device, such as a 3D NAND Flash memory device), in accordance with additional embodiments of the disclosure. As shown in FIG. 9, the microelectronic device structure 500 is formed to be similar to the microelectronic device structure 100 at the processing stage previously described with reference to FIGS. 5A through 5C, except that each block 533 of the stack structure 532 includes a different distribution of at least some of the contact structures 540 within the horizontal area thereof. For example, within a horizontal area of at least one of the opposing staircase structures 516 (e.g., the forward staircase structure 516A and/or the reverse staircase structure 516B) of the first stadium structure 514A of each block 533, the microelectronic device structure 500 may include multiple (e.g., more than one) rows of the second contact structures 540B. The multiple rows of the second contact structures 540B may each horizontally extend in the X-direction, and may each be substantially aligned in the Y-direction with at least one row of the first contact structures 540A. By way of non-limiting example, if an individual block 533 of the stack structure 532 includes four (4) rows of the first contact structures 540A, the block 533 may also include four (4) rows of the second contact structures 540B.

Figure 10:
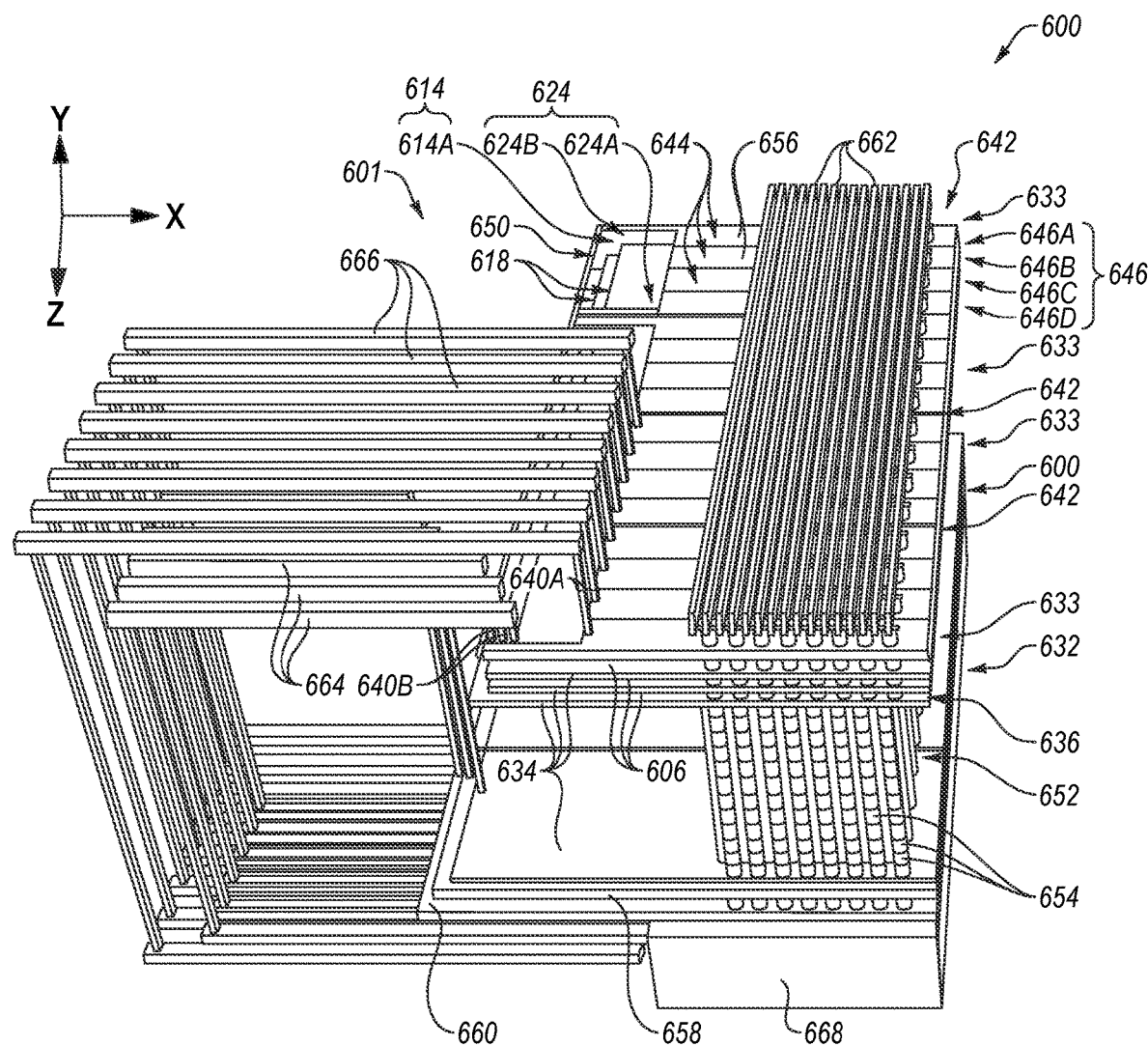
FIG. 10 is a simplified partial cutaway perspective view of a microelectronic device, in accordance with embodiments of the disclosure.

Microelectronic device structures (e.g., the microelectronic device structures 100, 200, 300, 400, 500 previously described with reference to FIGS. 5A through 5C, 6, 7, 8, and 9) of the disclosure may be included in microelectronic devices of the disclosure. For example, FIG. 10 illustrates a partial cutaway perspective view of a portion of a microelectronic device 601 (e.g., a memory device, such as a 3D NAND Flash memory device) including a microelectronic device structure 600. The microelectronic device structure 600 may be substantially similar to one of the microelectronic device structures 100, 200, 300, 400, 500 previously described with reference to FIGS. 5A through 5C, 6, 7, 8, and 9. For clarity and ease of understanding the drawings and associated description, some features (e.g., structures, materials) of the microelectronic device structures 100, 200, 300, 400, 500 previously described herein are not shown in FIG. 10. However, it will be understood that any features of the microelectronic device structures 100, 200, 300, 400, 500 previously described with reference to one or more of FIGS. 5A through 5C, 6, 7, 8, and 9 may be included in the microelectronic device structure 600 of the microelectronic device 601 described herein with reference to FIG. 10.

As shown in FIG. 10, in addition to the features of the microelectronic device structure 600 previously described herein in relation to one or more of the microelectronic device structures 100, 200, 300, 400, 500 (FIGS. FIGS. 5A through 5C, 6, 7, 8, and 9), the microelectronic device 601 may further include cell pillar structures 652 vertically extending through each block 633 of the stack structure 632. The cell pillar structures 652 may be positioned within regions (e.g., memory array regions) of the block 633 horizontally offset (e.g., in the X-direction) from the stadium structures 614 (e.g., the first stadium structure 614A) (and, hence, the bridge regions 624 and the further filled slot structures 650) within the blocks 633. Intersections of the cell pillar structures 652 and the conductive material 634 of the tiers 636 of the stack structure 632 within the horizontal areas of the blocks 633 form strings of memory cells 654 vertically extending through each block 633 of the stack structure 202. For each string of memory cells 654, the memory cells 654 thereof may be coupled in series with one another. Within each block 633, the conductive material 634 of some of the tiers 636 of the stack structure 632 may serve as access line structures (e.g., word line structures) for the strings of memory cells 654 within the horizontal area of the block 633. In some embodiments, within each block 633, the memory cells 654 formed at the intersections of the conductive material 634 of some of the tiers 636 and the cell pillar structures 652 comprise so-called "MONOS" (metal-oxide-nitride-oxide-semiconductor) memory cells. In additional embodiments, the memory cells 654 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 654 comprise so-called "floating gate" memory cells including floating gates (e.g., metallic floating gates) as charge storage structures. The floating gates may horizontally intervene between central structures of the cell pillar structures 652 and the conductive material 634 of the different tiers 636 of the stack structure 632.

The microelectronic device 601 may further include at least one source structure 660, access line routing structures 664, first select gates 656 (e.g., upper select gates, drain select gates (SGDs)), select line routing structures 666, one or more second select gates 658 (e.g., lower select gates, source select gate (SGSs)), and digit line structures 662. The digit line structures 662 may vertically overlie and be coupled to the cell pillar structures 652 (and, hence, the strings of memory cells 654). The source structure 660 may vertically underlie and be coupled to the cell pillar structures 652 (and, hence, the strings of memory cells 654). In addition, the first contact structures 640A (e.g., select line contact structures) and the second contact structures 640B (e.g., access line contact structures) may couple various features of the microelectronic device 601 to one another as shown (e.g., the select line routing structures 666 to the first select gates 656; the access line routing structures 664 to the conductive materials 634 of the tiers 636 of the stack structure 602 underlying the first select gates 656 and defining access line structures of the microelectronic device 601).

The microelectronic device 601 may also include a base structure 668 positioned vertically below the cell pillar structures 652 (and, hence, the strings of memory cells 654). The base structure 668 may include at least one control logic region including control logic devices configured to control various operations of other features (e.g., the strings of memory cells 654) of the microelectronic device 601. As a non-limiting example, the control logic region of the base structure 668 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 668 may be coupled to the source structure 660, the access line routing structures 664, the select line routing structures 666, and the digit line structures 662. In some embodiments, the control logic region of the base structure 668 includes CMOS (complementary metal-oxide-semiconductor) circuitry. In such embodiments, the control logic region of the base structure 668 may be characterized as having a "CMOS under Array" ("CuA") configuration.

Thus, in accordance with embodiments of the disclosure, a memory device comprises a stack structure comprising tiers each comprising a conductive material and an insulative material vertically neighboring the conductive material. The stack structure is divided into blocks extending in parallel in a first direction and separated from one another in a second direction by dielectric slot structures. Each of the blocks comprises a stadium structure comprising opposing staircase structures individually having steps comprising horizontal ends of at least some the tiers of the stack structure, and a central portion between the opposing staircase structures in the first direction; first elevated regions neighboring opposing ends of the stadium structure in the first direction; and second elevated regions neighboring opposing sides of the stadium structure in the second direction, uppermost surfaces of the second elevated regions substantially coplanar with uppermost surfaces of the first elevated regions. The memory device further comprises at least one additional dielectric slot structure, and strings of memory cells. The at least one additional dielectric slot structure is within horizontal boundaries in the first direction of the central portion of the stadium structure of each of the blocks, and horizontally and vertically extends through the second elevated regions of each of the blocks. The strings of memory cells vertically extend through a portion of each of the blocks neighboring the stadium structure in the first direction.

Figure 11:
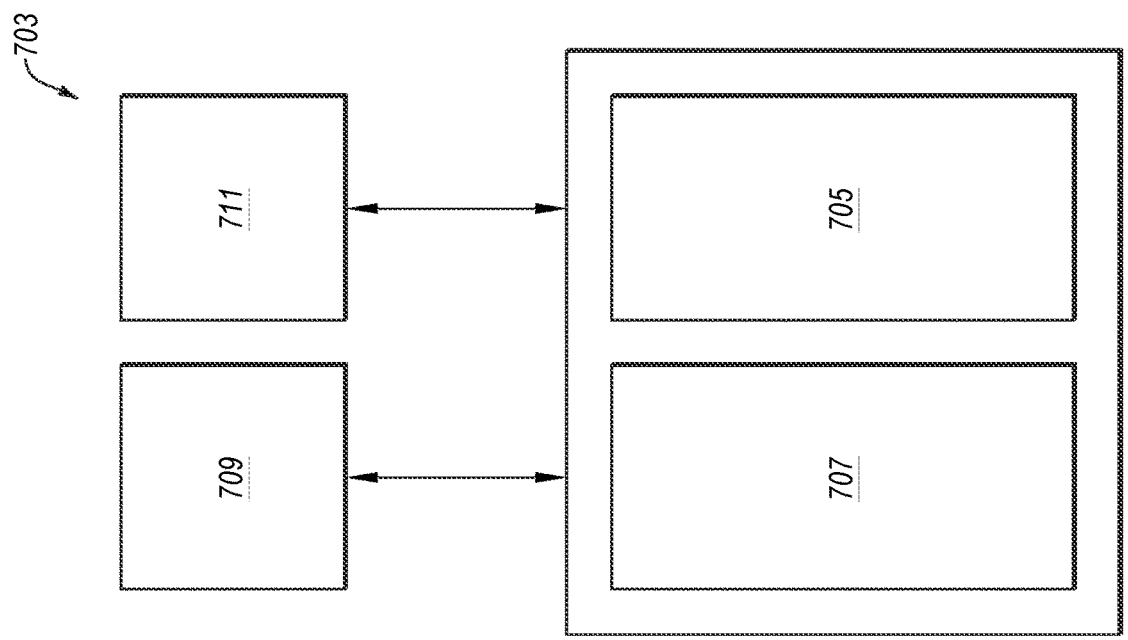
FIG. 11 is a schematic block diagram illustrating an electronic system, in accordance with embodiments of the disclosure.

Microelectronic devices structures (e.g., the microelectronic device structures 100, 200, 300, 400, 500 previously described with reference to FIGS. 5A through 5C, 6, 7, 8, and 9) and microelectronic devices (e.g., the microelectronic device 601 (FIG. 10)) in accordance with embodiments of the disclosure may be used in embodiments of electronic systems of the disclosure. For example, FIG. 11 is a block diagram of an illustrative electronic system 703 according to embodiments of disclosure. The electronic system 703 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 703 includes at least one memory device 705. The memory device 705 may comprise, for example, one or more of a microelectronic device structure (e.g., one of the microelectronic device structures 100, 200, 300, 400, 500 previously described with reference to FIGS. 5A through 5C, 6, 7, 8, and 9) and a microelectronic device (e.g., the microelectronic device 601 (FIG. 10)) previously described herein. The electronic system 703 may further include at least one electronic signal processor device 707 (often referred to as a "microprocessor"). The electronic signal processor device 707 may, optionally, include one or more of a microelectronic device structure (e.g., one of the microelectronic device structures 100, 200, 300, 400, 500 previously described with reference to FIGS. 5A through 5C, 6, 7, 8, and 9) and a microelectronic device (e.g., the microelectronic device 601 (FIG. 10)) previously described herein. While the memory device 705 and the electronic signal processor device 707 are depicted as two (2) separate devices in FIG. 11, in additional embodiments, a single (e.g., only one) memory/processor device having the functionalities of the memory device 705 and the electronic signal processor device 707 is included in the electronic system 703. In such embodiments, the memory/processor device may include one or more of a microelectronic device structure (e.g., one of the microelectronic device structures 100, 200, 300, 400, 500 previously described with reference to FIGS. 5A through 5C, 6, 7, 8, and 9) and a microelectronic device (e.g., the microelectronic device 601 (FIG. 10)) previously described herein. The electronic system 703 may further include one or more input devices 709 for inputting information into the electronic system 703 by a user, such as, for example, a mouse or other pointing device, a keyboard, a touchpad, a button, or a control panel. The electronic system 703 may further include one or more output devices 711 for outputting information (e.g., visual or audio output) to a user such as, for example, a monitor, a display, a printer, an audio output jack, a speaker, etc. In some embodiments, the input device 709 and the output device 711 comprise a single touchscreen device that can be used both to input information to the electronic system 703 and to output visual information to a user. The input device 709 and the output device 711 may communicate electrically with one or more of the memory device 705 and the electronic signal processor device 707.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising a vertically alternating sequence of conductive material and insulative material arranged in tiers. The stack structure further comprises at least two blocks separated by at least one intervening dielectric structure. Each of the at least two blocks comprises two elevated regions, a stadium structure, and two additional elevated regions. The stadium structure is interposed between the two elevated regions in a first horizontal direction and comprises staircase structures opposing one another in the first horizontal direction. The staircase structures each have steps comprising horizontal ends of the tiers of the stack structure. The two additional elevated regions neighbor opposing sides of the stadium structure in a second horizontal direction perpendicular to the first horizontal direction. Upper boundaries of the two additional elevated regions are substantially coplanar with upper boundaries of the two elevated regions. The at least one microelectronic device structure further comprises at least one dielectric slot structure within horizontal boundaries of the stadium structure in the first horizontal direction. The at least one dielectric slot structure horizontally and vertically extends through each of the two additional elevated regions of each of the at least two blocks of the stack structure.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
a stack structure comprising a vertically alternating sequence of conductive material and insulative material arranged in tiers, the stack structure having blocks separated from one another by first dielectric slot structures, each of the blocks comprising:
two crest regions;
an uppermost stadium structure interposed between the two crest regions in a first horizontal direction and comprising opposing staircase structures each having steps comprising edges of an upper group of the tiers of the stack structure;
two bridge regions neighboring opposing sides of the uppermost stadium structure in a second horizontal direction orthogonal to the first horizontal direction and having upper surfaces substantially coplanar with upper surfaces of the two crest regions; and at least one second dielectric slot structure partially within horizontal boundaries of the uppermost stadium structure in the first horizontal direction and horizontally overlapping the two bridge regions in the second horizontal direction, the at least one second dielectric slot structure partially vertically extending through and partially segmenting each of the two bridge regions, lowermost boundaries of the at least one second dielectric slot structure vertically overlying lowermost boundaries of the uppermost stadium structure such that upper portions of the two bridge regions are respectively partially non-continuous in the first horizontal direction while lower portions of the two bridge regions are respectively substantially continuous in first horizontal direction.

2. The microelectronic device of claim 1, further comprising a filled trench vertically overlying within horizontal boundaries of the uppermost stadium structure, the filled opening comprising:
a first dielectric material on the opposing staircase structures of the stadium structure and on inner sidewalls of the two bridge regions;
a second dielectric material on the first dielectric material and having a different material composition than the first dielectric material; and
a third dielectric material on the second dielectric material and having a different material composition than the second dielectric material.

3. The microelectronic device of claim 2, wherein:
the first dielectric material comprises a dielectric oxide material; and
the second dielectric material comprises a dielectric nitride material.

4. The microelectronic device of claim 2, wherein a portion of the at least one second dielectric slot structure is positioned within horizontal boundaries of the filled trench, the portion of at least one second dielectric slot structure partially vertically extending through the filled trench.

5. A microelectronic device, comprising:
a stack structure comprising a vertically alternating sequence of conductive material and insulative material arranged in tiers, the stack structure having blocks separated from one another by first dielectric slot structures, each of the blocks comprising:
two crest regions;
a stadium structure interposed between the two crest regions in a first horizontal direction and comprising opposing staircase structures each having steps comprising edges of the tiers of the stack structure;
two bridge regions neighboring opposing sides of the stadium structure in a second horizontal direction orthogonal to the first horizontal direction and having upper surfaces substantially coplanar with upper surfaces of the two crest regions; and
a filled trench vertically overlying within horizontal boundaries of the stadium structure, the filled opening comprising:
a first dielectric material on the opposing staircase structures of the stadium structure and on inner sidewalls of the two bridge regions;
a second dielectric material on the first dielectric material and having a different material composition than the first dielectric material; and
a third dielectric material on the second dielectric material and having a different material composition than the second dielectric material; and at least one second dielectric slot structure within horizontal boundaries of the stadium structure in the first horizontal direction and partially vertically extending through and segmenting each of the two bridge regions, the at least one second dielectric slot structure comprising:
a portion positioned within horizontal boundaries of the filled trench, the portion partially vertically extending through the filled trench and continuously extending in the second horizontal direction from a first of the two bridge regions to a second of the two bridge regions;
an additional portion continuously extending in the second horizontal direction through the first of the two bridge regions and to a first of the first dielectric slot structures; and
a further portion continuously extending in the second horizontal direction through the second of the two bridge regions and to a second of the first dielectric slot structures.

6. The microelectronic device of claim 1, wherein the at least one second dielectric slot structure comprises only one second dielectric slot structure continuously extending in the second horizontal direction across more than one of the blocks of the stack structure and across at least one of the first dielectric slot structures interposed between the more than one of the blocks of the stack structure.

7. The microelectronic device of claim 1, wherein the at least one second dielectric slot structure is within boundaries in the first horizontal direction of a central portion of the uppermost stadium structure interposed between the opposing staircase structures of the uppermost stadium structure.

8. The microelectronic device of claim 1, wherein the at least one second dielectric slot structure comprises at least two second dielectric slot structures extending in parallel in the second horizontal direction.

9. The microelectronic device of claim 1, wherein the at least one second dielectric slot structure comprises at least two second dielectric slot structures extending in series in the second horizontal direction.

10. The microelectronic device of claim 1, further comprising third dielectric slot structures with a horizontal area of each of the blocks of the stack structure, the third dielectric slot structures partially vertically extending through each of the blocks of the stack structure and horizontally extending in the first horizontal direction through one of the two crest regions of each of the blocks of the stack structure and into one of the opposing staircase structures of the uppermost stadium structure of each of the blocks of the stack structure.

11. The microelectronic device of claim 10, wherein each of the third dielectric slot structures is completely horizontally offset from the at least one second dielectric slot structure in the first horizontal direction.

12. A memory device, comprising:
a stack structure comprising tiers each comprising a conductive material and an insulative material vertically neighboring the conductive material, the stack structure divided into blocks extending in parallel in a first direction and separated from one another in a second direction by dielectric slot structures, each of the blocks comprising:

an uppermost stadium structure comprising:
  opposing staircase structures individually having steps comprising horizontal ends of an upper group of the tiers of the stack structure; and
  a central portion between the opposing staircase structures in the first direction;
first elevated regions neighboring opposing ends of the uppermost stadium structure in the first direction; and
second elevated regions neighboring opposing sides of the uppermost stadium structure in the second direction, uppermost surfaces of the second elevated regions substantially coplanar with uppermost surfaces of the first elevated regions;
at least one additional dielectric slot structure within horizontal boundaries in the first direction of the central portion of the uppermost stadium structure of each of the blocks and horizontally overlapping the second elevated regions of each of the blocks in the second direction,
  the at least one additional dielectric slot structure partially vertically extending through and partially segmenting both the second elevated regions of each of the blocks,
  lowermost boundaries of the at least one additional dielectric slot structure vertically overlying lowermost boundaries of the uppermost stadium structure of each of the blocks such that upper portions of the second elevated regions of each of the blocks are respectively partially non-continuous in the first direction while lower portions of the second elevated regions of each of the blocks are respectively substantially continuous in first direction; and
strings of memory cells vertically extending through a portion of each of the blocks neighboring the stadium structure in the first direction.

13. The memory device of claim 12, further comprising, within each of the blocks, a filled trench vertically overlying and within a horizontal area of the uppermost stadium structure, the filled trench comprising:
  a dielectric oxide liner material on the opposing staircase structures and the central portion of the uppermost stadium structure, and on inner side surfaces of bridge regions;
  a dielectric nitride liner material on the dielectric oxide liner material; and
  a dielectric fill material on the dielectric nitride liner material.

14. The memory device of claim 12, further comprising, within each of the blocks, further dielectric slot structures extending in parallel with one another in the first direction and completely horizontally offset from the at least one additional dielectric slot structure in the first direction.

15. The memory device of claim 12, further comprising:
digit lines overlying the stack structure and electrically coupled to the strings of memory cells;
a source structure underlying the stack structure and electrically coupled to the strings of memory cells;
conductive contact structures on at least some of the steps of the opposing staircase structures of the uppermost stadium structure;
conductive routing structures coupled to the conductive contact structures; and
a control logic devices coupled to the source structure, the digit lines, and the conductive routing structures.

16. An electronic system, comprising:
an input device;
an output device;
a processor device operably coupled to the input device and the output device; and
a memory device operably coupled to the processor device and comprising at least one microelectronic device structure comprising:
  a stack structure comprising a vertically alternating sequence of conductive material and insulative material arranged in tiers, the stack structure comprising at least two blocks separated by at least one intervening dielectric structure, each of the at least two blocks comprising:
  two elevated regions;
  an uppermost stadium structure interposed between the two elevated regions in a first horizontal direction and comprising staircase structures opposing one another in the first horizontal direction, the staircase structures each having steps comprising horizontal ends of an upper group of the tiers of the stack structure;
  two additional elevated regions neighboring opposing sides of the uppermost stadium structure in a second horizontal direction perpendicular to the first horizontal direction, upper boundaries of the two additional elevated regions substantially coplanar with upper boundaries of the two elevated regions; and
at least one dielectric slot structure within horizontal boundaries of the uppermost stadium structure in the first horizontal direction and horizontally overlapping the two additional elevated regions of each of the at least two blocks in the second horizontal direction,
  the at least one dielectric slot structure only partially vertically extending through and segmenting both of the two additional elevated regions of each of the at least two blocks,
  vertically lowermost boundaries of the at least one dielectric slot structure vertically overlying vertically lowermost boundaries of the uppermost stadium structure of each of the at least two blocks such that upper portions of the two additional elevated regions of each of the at least two blocks are respectively partitioned in the first horizontal direction while lower portions of the two additional elevated regions of each of the at least two blocks are respectively substantially continuous in first horizontal direction.

* * * * *

UNITED STATES PATENT AND TRADEMARK OFFICE
CERTIFICATE OF CORRECTION

PATENT NO. : 11,917,817 B2
APPLICATION NO. : 17/125200
DATED : February 27, 2024
INVENTOR(S) : Shuangqiang Luo et al.

It is certified that error appears in the above-identified patent and that said Letters Patent is hereby corrected as shown below:

In the Specification
Column 4, Line 5, change "identities) are" to --identities) that are--
Column 5, Line 20, change "palladium (Pa), platinum" to --palladium (Pd), platinum--

Signed and Sealed this
Twenty-third Day of April, 2024

Katherine Kelly Vidal
*Director of the United States Patent and Trademark Office*